(12) United States Patent
Chaji et al.

(10) Patent No.: US 10,847,571 B2
(45) Date of Patent: Nov. 24, 2020

(54) MICRO DEVICE INTEGRATION INTO SYSTEM SUBSTRATE

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 16/107,692

(22) Filed: Aug. 21, 2018

(65) Prior Publication Data

US 2018/0358405 A1     Dec. 13, 2018

Related U.S. Application Data

(60) Division of application No. 15/060,942, filed on Mar. 4, 2016, now Pat. No. 10,134,803, which is a (Continued)

(30) Foreign Application Priority Data

Jan. 23, 2015  (CA) .................................. 2879465
Jan. 23, 2015  (CA) .................................. 2879627

(Continued)

(51) Int. Cl.
*H01L 33/60*     (2010.01)
*H01L 27/15*     (2006.01)
(Continued)

(52) U.S. Cl.
CPC ........ *H01L 27/156* (2013.01); *H01L 21/6835* (2013.01); *H01L 24/05* (2013.01);
(Continued)

(58) Field of Classification Search
CPC ....................................................... H01L 33/60
See application file for complete search history.

(56) References Cited

U.S. PATENT DOCUMENTS

2002/0048137 A1   4/2002  Williams
2004/0251821 A1   12/2004  Cok
(Continued)

FOREIGN PATENT DOCUMENTS

CA        2880718      7/2016
CA        2887186      11/2016
(Continued)

OTHER PUBLICATIONS

International Search Report and Written Opinion for International Application No. PCT/IB2018/055347 dated Nov. 9, 2018 (17 pages).
(Continued)

*Primary Examiner* — Peniel M Gumedzoe
*Assistant Examiner* — Christopher A Johnson
(74) *Attorney, Agent, or Firm* — Nixon Peabody LLP

(57) ABSTRACT

Post-processing steps for integrating of micro devices into system (receiver) substrate or improving the performance of the micro devices after transfer. Post processing steps for additional structures such as reflective layers, fillers, black matrix or other layers may be used to improve the out coupling or confining of the generated LED light. Dielectric and metallic layers may be used to integrate an electro-optical thin film device into the system substrate with transferred micro devices. Color conversion layers may be integrated into the system substrate to create different outputs from the micro devices.

13 Claims, 82 Drawing Sheets

Related U.S. Application Data continuation-in-part of application No. 15/002,662, filed on Jan. 21, 2016.

(30) Foreign Application Priority Data

| | | |
|---|---|---|
| Jan. 28, 2015 | (CA) | 2880718 |
| Mar. 4, 2015 | (CA) | 2883914 |
| Apr. 8, 2015 | (CA) | 2887186 |
| May 4, 2015 | (CA) | 2890398 |
| Jul. 29, 2015 | (CA) | 2898735 |

(51) Int. Cl.

| | |
|---|---|
| *H01L 23/00* | (2006.01) |
| *H01L 33/40* | (2010.01) |
| *H01L 21/683* | (2006.01) |
| *H01L 25/075* | (2006.01) |
| *H01L 21/48* | (2006.01) |
| *H01L 33/58* | (2010.01) |
| *H01L 33/62* | (2010.01) |
| *H01L 33/46* | (2010.01) |

(52) U.S. Cl.
CPC .............. *H01L 24/13* (2013.01); *H01L 24/24* (2013.01); *H01L 24/92* (2013.01); *H01L 24/96* (2013.01); *H01L 24/97* (2013.01); *H01L 25/0753* (2013.01); *H01L 33/405* (2013.01); *H01L 21/486* (2013.01); *H01L 24/08* (2013.01); *H01L 24/16* (2013.01); *H01L 24/32* (2013.01); *H01L 24/80* (2013.01); *H01L 24/83* (2013.01); *H01L 33/46* (2013.01); *H01L 33/58* (2013.01); *H01L 33/62* (2013.01); *H01L 2221/68322* (2013.01); *H01L 2221/68354* (2013.01); *H01L 2221/68363* (2013.01); *H01L 2221/68368* (2013.01); *H01L 2221/68381* (2013.01); *H01L 2224/0401* (2013.01); *H01L 2224/04105* (2013.01); *H01L 2224/08225* (2013.01); *H01L 2224/12105* (2013.01); *H01L 2224/16227* (2013.01); *H01L 2224/16237* (2013.01); *H01L 2224/24137* (2013.01); *H01L 2224/32225* (2013.01); *H01L 2224/32235* (2013.01); *H01L 2224/80004* (2013.01); *H01L 2224/80006* (2013.01); *H01L 2224/80385* (2013.01); *H01L 2224/80907* (2013.01); *H01L 2224/81385* (2013.01); *H01L 2224/83002* (2013.01); *H01L 2224/83005* (2013.01); *H01L 2224/83385* (2013.01); *H01L 2224/83907* (2013.01); *H01L 2224/92* (2013.01); *H01L 2224/9202* (2013.01); *H01L 2224/96* (2013.01); *H01L 2224/97* (2013.01); *H01L 2924/12041* (2013.01); *H01L 2924/1461* (2013.01); *H01L 2933/0016* (2013.01); *H01L 2933/0058* (2013.01)

(56) References Cited

U.S. PATENT DOCUMENTS

| | | |
|---|---|---|
| 2004/0262614 A1 | 12/2004 | Hack |
| 2006/0102913 A1 | 5/2006 | Park |
| 2007/0045620 A1 | 3/2007 | Park |
| 2009/0302339 A1 | 12/2009 | Yamazaki |
| 2011/0216272 A1 | 9/2011 | Yoshida |
| 2013/0130440 A1 | 5/2013 | Hu |
| 2013/0157438 A1 | 6/2013 | Maeda |
| 2013/0214302 A1* | 8/2013 | Yeh ................. H01L 33/48 257/88 |
| 2014/0151678 A1 | 6/2014 | Sakuma |
| 2014/0333683 A1 | 11/2014 | Qi |
| 2014/0361265 A1 | 12/2014 | Liu |
| 2014/0367633 A1* | 12/2014 | Bibl ................. G02F 1/133603 257/13 |
| 2014/0367711 A1 | 12/2014 | **Bibl |
| 2015/0060820 A1 | 3/2015 | Takagi |
| 2015/0144974 A1 | 5/2015 | Clen |
| 2015/0228513 A1 | 8/2015 | Parkhe |
| 2016/0064363 A1 | 3/2016 | Bower |

FOREIGN PATENT DOCUMENTS

| | | |
|---|---|---|
| CA | 2890398 | 11/2016 |
| CN | 103904073 | 7/2014 |
| EP | 1750308 | 2/2007 |
| WO | 1997/023903 | 7/1997 |
| WO | 2002/084631 | 10/2002 |
| WO | 03/088359 | 10/2003 |
| WO | 2014/165151 | 10/2014 |
| WO | 2015/081289 | 6/2015 |

OTHER PUBLICATIONS

International Search Report and Written Opinion for International Application No. PCT/IB2016/050307, dated May 4, 2016 (7 Pages).
International Search Report and Written Opinion for International Application No. PCT/IB2017/051297, dated May 17, 2017 (7 Pages).

* cited by examiner

MICRO DEVICE INTEGRATION INTO SYSTEM SUBSTRATE

CROSS-REFERENCE TO RELATED APPLICATION(S)

This application is a divisional under 35 U.S.C. § 121 and claims priority under 35 U.S.C. § 120 to U.S. application Ser. No. 15/060,942 (3USP1) filed on Mar. 4, 2016, which in turn is a continuation-in-part to U.S. application Ser. No. 15/002,662, filed Jan. 21, 2016 (3USPT), which claims priority to Canadian Application No. 2,890,398, filed May 4, 2015 (129CAPL), Canadian Application No. 2,883,914, filed Mar. 4, 2015 (128CAPL), Canadian Application No. 2,880,718, filed Jan. 28, 2015 (127CAPL), Canadian Application No. 2,879,465, filed Jan. 23, 2015 (125CAPL), and Canadian Application No. 2,879,627, filed Jan. 23, 2015 (99CAPL), each of which is hereby incorporated by reference herein in its entirety. This application also claims priority to Canadian Application No. 2,898,735, filed Jul. 29, 2015 (8CAP2) and Canadian Application No. 2,887,186, filed Apr. 8, 2015 (128CAP2), each of which is hereby incorporated by reference herein in its entirety.

FIELD OF THE INVENTION

The present disclosure relates to the transferred micro device system integration on a receiver substrate. More specifically, the present disclosure relates to the post processing steps for enhancing the performance of microdevices after transferring into a receiver substrate including the development of optical structure, the integration of electro-optical thin film devices, the addition of color conversion layers, and the proper patterning of devices on a donor substrate.

BRIEF SUMMARY

A few embodiments of this description are related to post-processing steps for improving the performance of the micro devices. For example, in some embodiments, the micro device array may comprise micro light emitting diodes (LEDs), Organic LEDs, sensors, solid state devices, integrated circuits, (micro-electro-mechanical systems) MEMS, and/or other electronic components. The receiving substrate may be, but is not no limited to, a printed circuit board (PCB), thin film transistor backplane, integrated circuit substrate, or, in one case of optical micro devices such as LEDs, a component of a display, for example a driving circuitry backplane. In these embodiments, in addition to interconnecting the micro devices, post processing steps for additional structure such as reflective layers, fillers, black matrix or other layers may be used to improve the out coupling of the generated LED light. In another example, dielectric and metallic layers may be used to integrate an electro-optical thin film device into the system substrate with the transferred micro devices.

In one embodiment, the active area of the pixel (or sub-pixel) is extended to be larger than the micro device by using fillers, for example, a dielectric. Here, the filler is patterned to define the pixel active area. Herein a pixel (or sub-pixel) active area is defined as the area that emits from the pixel (or sub-pixel), light produced by the light emitting micro device (or devices) or in the case of a sensor serves to gather and direct received light to a light sensing micro device of the pixel (or sub-pixel). In another embodiment reflective layers are used to confine the light within the active area.

According to one aspect, there is provided a method of integrated device fabrication, the integrated device comprising a plurality of pixels each comprising at least one sub-pixel comprising a micro device integrated on a substrate, the method comprising: extending an active area of a first sub-pixel to an area larger than an area of a first micro device of the first sub-pixel by patterning of a filler layer about the first micro device and between the first micro device and at least one second micro device.

One embodiment includes fabricating at least one reflective layer covering at least a portion of one side of the patterned filler layer, the reflective layer for confining at least a portion of incoming or outgoing light within the active area of the sub-pixel.

In one case, the reflective layer is fabricated as an electrode of the micro device In one case, the patterning of the filler layer further patterns the filler layer about a further sub-pixel.

In another embodiment, the patterning of the filler layer further is performed with a dielectric filler material.

According to another aspect, there is provided an integrated device comprising: a plurality of pixels each comprising at least one sub-pixel comprising a micro device integrated on a substrate; and a patterned filler layer formed about a first micro device of a first sub-pixel and between the first micro device and at least one second micro device, the patterned filler layer extending an active area of the first sub-pixel to an area larger than an area of the first micro device.

In one case, the integrated device further comprises: at least one reflective layer covering at least a portion of one side of the patterned filler layer, the reflective layer for confining at least a portion of incoming or outgoing light to the active area of the first sub-pixel.

In one case, the reflective layer is an electrode of the micro device.

In one embodiment, the patterned filler layer is formed about a further sub-pixel.

According to a further aspect there is provided a method of integrated device fabrication, the device comprising a plurality of pixels each comprising at least one sub-pixel comprising a micro device integrated on a substrate, the method comprising: integrating at least one micro device into a receiver substrate; and subsequently to the integration of the at least one micro device, integrating at least one thin-film electro-optical device into the receiver substrate.

In some embodiments integrating the at least one thin-film electro-optical device comprises forming an optical path for the micro device through all or some layers of the at least one electro-optical device.

In some embodiments integrating the at least one thin-film electro-optical device is such that an optical path for the micro device is through a surface or area of the integrated device other than a surface or area of the electro-optical device.

Some embodiments further comprise fabricating an electrode of the thin-film electro-optical device, the electrode of the thin-film electro-optical device defining an active area of at least one of a pixel and a sub-pixel.

Some embodiments further comprise fabricating an electrode which serves as a shared electrode of both the thin-film electro-optical device and the light emitting micro device.

In one embodiment, one of the micro device electrodes can serve as the reflective layer.

In another embodiment, the active area can consist of a few sub-pixels or pixels.

The active area can be larger, smaller, or the same size as the pixel (or sub-pixel) area.

In this description pixel active area and sub-pixel active area are used interchangeably. However, it is clear to one skilled in the art that the pixel and/or sub-pixel can be used in all the embodiments described here.

In another embodiment, thin film electro-optical devices are deposited onto the receiver substrate after the micro devices are integrated into the receiver substrate.

In one embodiment, an optical path is developed for the micro device to emits (or absorb) light through all or some layers of the electro-optical device.

In another embodiment, the optical path for the micro device is not through all or some layers of the electro-optical device.

In one embodiment, the electro-optical device is a thin film device.

In another embodiment, the electrode of the electro-optical device is used to define the active area of the pixel (or sub-pixel).

In another embodiment, at least one of the electro-optical device electrodes is shared with the micro-device electrode.

In one embodiment, color conversion material covers the surface and surrounds partially (or fully) the body of the micro device.

In one embodiment, the bank structure separates the color conversion materials.

In another embodiment, color conversion material covers the surface (and/or partially or fully the body of) the active area.

In one embodiment, the micro devices on donor substrate are patterned to match the array structure in the receiver (system) substrate. In this case, all the devices in part (or all) of the donor substrate are transferred to the receiver substrate.

In another embodiment, VIAs are created in the donor substrate to couple the micro devices on the donor substrate with the receiver substrate.

In another embodiment, the donor substrate has more than one micro device type and at least in one direction the pattern of the micro device types on the donor substrate matches partially or fully the pattern of the corresponding areas (or pads) on the system substrate.

In another embodiment, the donor substrate has more than one micro device type and at least in one direction the pitch between different micro devices in donor substrate is a multiple of the pitch of the corresponding areas (or pads) on the system substrate.

In another embodiment, the donor substrate has more than one micro device type. At least in one direction, the pitch between two different micro devices matches the pitch of the corresponding areas (or pads) on the receiver (or system) substrate.

In one embodiment, the pattern of different micro device types on the donor substrate creates a two dimensional array of each type where the pitch between each array of different types matches the pitch of the corresponding areas on the system substrate.

In another embodiment, the pattern of different micro device types on the donor substrate creates a one dimensional array where the pitch of the arrays matches the pitch of the corresponding areas (or pads) on the system substrate.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

Figure 1:
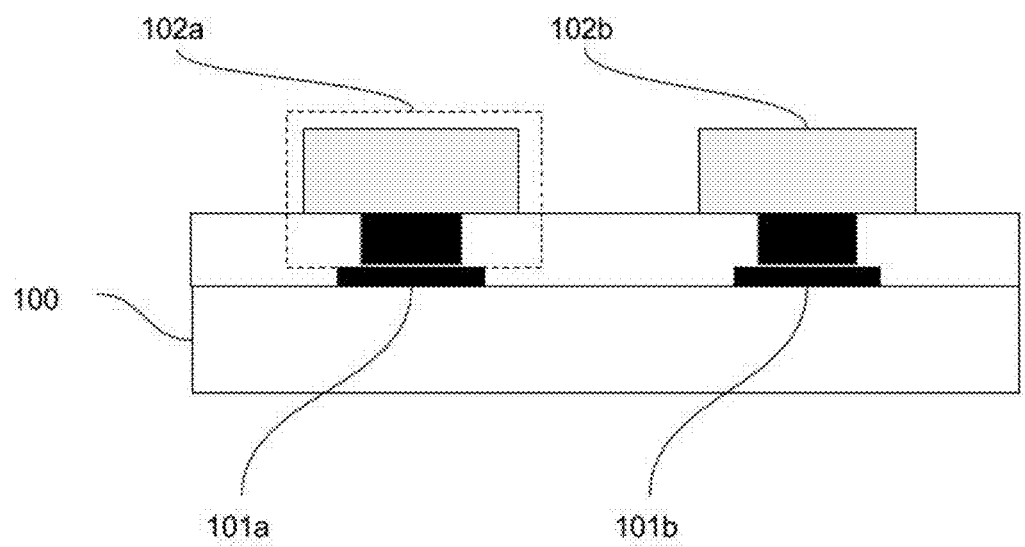
FIG. 1 shows a receiver substrate with contact pads, and an array of transferred micro-devices attached to the receiver substrate.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

The process of developing a system based on micro devices consists of pre-processing the devices on a donor substrate (or a temporary substrate), transferring the micro devices from the donor substrate to the receiver substrate, and post processing to enable device functionality. The pre-processing step may include patterning and adding bonding elements. The transfer process may involve bonding of a pre-selected array of micro devices to the receiver substrate followed by removing the donor substrate. Several different selective transfer processes have already been developed for micro devices. After the integration of the micro devices into the receiving substrate, additional post processes may be performed to make required functional connections.

In this disclosure, "emissive device" is used to describe different integration and post processing methods. However, it is clear for one skilled in the art that other devices such as sensors can be used in these embodiments. For example, in case of sensor micro devices, the optical path will be similar to emissive micro devices but in reverse direction.

Some embodiments of this disclosure are related to post-processing steps for improving the performance of the micro devices. For example, in some embodiments, the micro device array may comprise micro light emitting diodes (LEDs), Organic LEDs, sensors, solid state devices, integrated circuits, MEMS (micro-electro-mechanical systems), and/or other electronic components. The receiving substrate may be, but is not no limited to, a printed circuit board (PCB), thin film transistor backplane, integrated circuit substrate, or, in one case of optical micro devices such as LEDs, a component of a display, for example a driving circuitry backplane. In these embodiments, in addition to interconnecting the micro devices, post processing steps for additional structure such as reflective layers, fillers, black matrix or other layers may be used to improve the out coupling of the generated LED light. In another example, dielectric and metallic layers may be used to integrate an electro-optical thin film device into the system substrate with the transferred micro devices.

In one embodiment, the active area of the pixel (or sub-pixel) is extended to be larger than the micro device by using fillers (or dielectric). Here, the filler is patterned to define the pixel's active area (the active area is the area that emits light or is absorbing input light). In another embodiment, reflective layers are used to confine the light within the active area.

In one embodiment, the reflective layer can be one of the micro device electrodes.

In another embodiment, the active area can consist of a few sub-pixels or pixels.

The active area can be larger, smaller, or the same size as the pixel (sub-pixel) area.

In another embodiment, thin film electro-optical devices are deposited into the receiver substrate after the micro devices are integrated into the receiver substrate.

In one embodiment, an optical path is developed for the micro device to emit (or absorb) light through all or some layers of the electro-optical device.

In another embodiment, the optical path for the micro device is not through all or some layers of the optoelectronic device.

In one embodiment, the optoelectronic device is a thin film device.

In another embodiment, the electrode of the electro-optical device is used to define the active area of the pixel (or sub-pixel).

In another embodiment, at least one of the electro-optical device electrodes is shared with the micro-device electrode.

In one embodiment color conversion material covers the surface and surrounds partially (or fully) the body of the micro device.

In one embodiment, the bank structure separates the color conversion materials.

In another embodiment, color conversion material covers the surface (and/or partially or fully the body of) the active area.

In one embodiment, the micro devices on donor substrate are patterned to match the array structure in the receiver (system) substrate. In this case, all the devices in part (or all) of the donor substrate are transferred to the receiver substrate.

In another embodiment, vias are created in the donor substrate to couple the micro devices on the donor substrate with the receiver substrate.

In another embodiment, the donor substrate has more than one micro device types and at least in one direction the pattern of the micro device types on the donor substrate matches partially or fully the pattern of the corresponding areas (or pads) on the system substrate.

In another embodiment, the donor substrate has more than one micro device types and at least in one direction the pitch between different micro devices in donor substrate is a multiple of the pitch of the corresponding area (or pads) on the system substrate.

In another embodiment, the donor substrate has more than one micro device type. At least in one direction, the pitch between two different micro devices matches the pitch of the corresponding areas (or pads) on the receiver (or system) substrate.

In one embodiment, the pattern of different micro device types on the donor substrate creates a two dimensional array of each type where the pitch between each array of different types matches the pitch of the corresponding areas on the system substrate.

In another embodiment, the pattern of different micro device types on the donor substrate creates a one dimensional array where the pitch of the arrays matches the pitch of the corresponding areas (or pads) on the system substrate.

FIG. 1 shows a receiver substrate 100, contact pads 101a and 101b, and micro devices 102a and 102b, being in an array attached to the receiver substrate 100. Contact pads 101 where micro devices 102 have been transferred, are located in an array on receiver substrate 100. Micro devices 102 are transferred from a donor substrate and bonded to the contact pads 101. Micro devices 102 can be any micro device that may typically be manufactured in planar batches including but not limited to LEDs, OLEDs, sensors, solid state devices, integrated circuits, MEMS, and/or other electronic components.

Figure 2A:
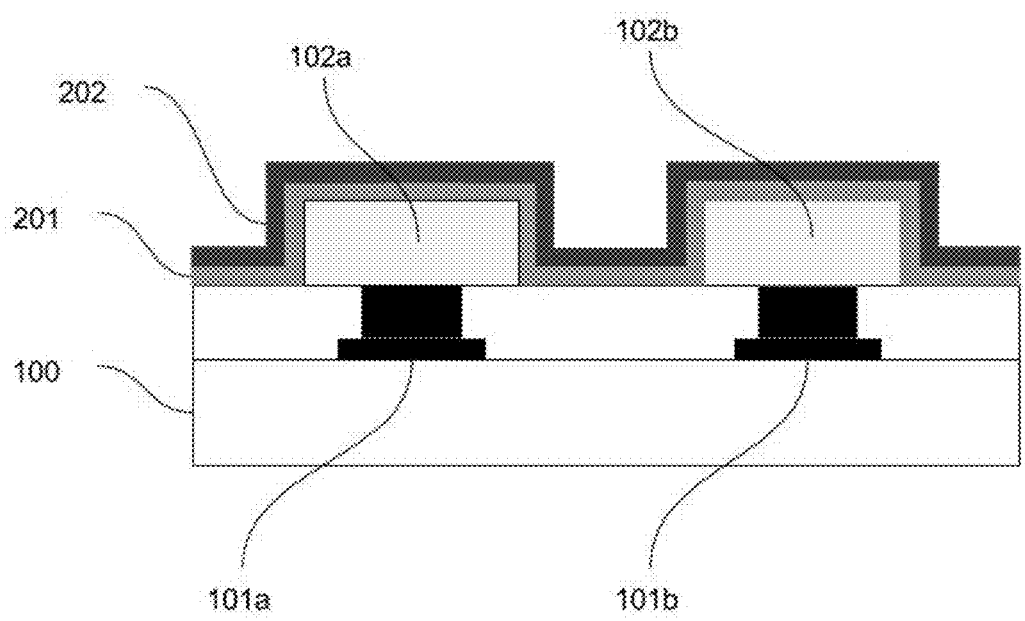
FIG. 2A shows a receiver substrate with contact pads, an array of transferred micro-devices attached to the receiver substrate, and conformal dielectric and reflective layers on top.

As depicted in FIG. 2A, in one embodiment where the micro devices 102 are micro LEDs, a conformal dielectric layer 201 and a reflective layer 202 may be formed over the bonded micro LEDs. In some embodiments, the conformal dielectric layer 201 is approximately 0.1-1 μm thick and it may be deposited by any of a number of different thin film deposition techniques. The conformal dielectric layer 201 isolates the micro LED sidewalls from the reflective layer 202. In addition, the dielectric layer 201 passivates and protects the micro LED sidewalls. The conformal dielectric layer 201 may also cover the top surface of the receiver substrate 100 between adjacent micro LED devices 102a and 102b. The conformal reflective layer 202 may be deposited over the dielectric layer 201. The reflective layer 202 may be a single layer or made up of multiple layers. A variety of conductive materials may be used as the reflective layer 202. In some embodiments, the conformal reflective layer 202 may be a metallic bilayer with a total thickness up to 0.5 μm.

Figure 2B:
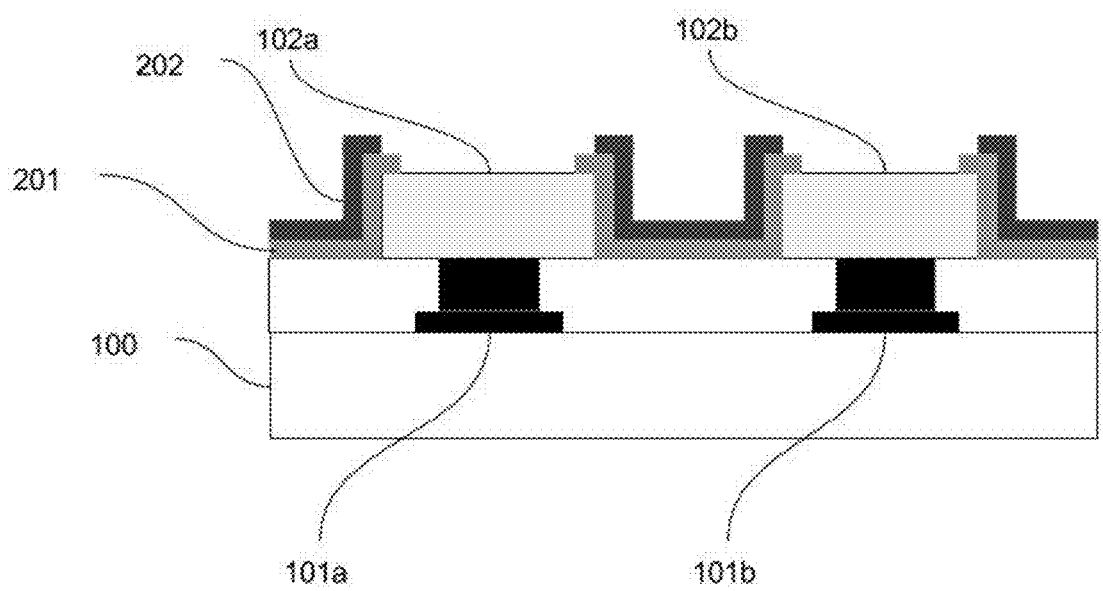
FIG. 2B shows a receiver substrate with contact pads, an array of transferred micro-devices attached to the receiver substrate, and patterned conformal dielectric and reflective layers.
Figure 2C:
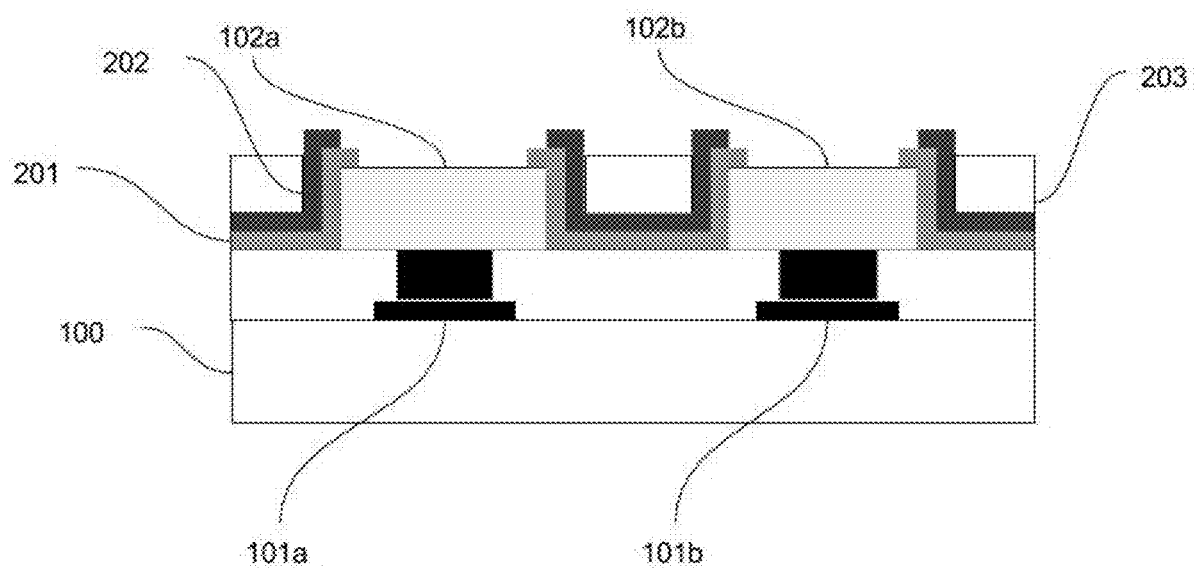
FIG. 2C shows a receiver substrate with contact pads, an array of transferred micro-devices attached to the receiver substrate, patterned conformal dielectric and reflective layers, and a black matrix layer formed between adjacent micro-devices.

Referring to FIG. 2B, the dielectric layer 201 and reflective layer 202 may then be patterned by using for example lithographic patterning and etching to partially expose the top surface of micro LEDs 102. In one embodiment where the micro LEDs are integrated into a backplane of a display system, referring also to FIG. 2C, a black matrix 203 may be formed between adjacent micro LEDs 102 and on the reflective layer 202 to reduce the reflection of the ambient light. In one example the black matrix 203 may be a layer of resins such as polyimide or polyacrylic in which particles of black pigment such as carbon black have been dispersed. In some embodiments, the thickness of the black matrix 203 may be 0.01-2 μm. This layer may be patterned and etched so as to expose the top surface of the micro LEDs 102 as shown in FIG. 2C. Optionally, the thickness of the black matrix 203 may be engineered to planarize the integrated substrate 100. In another embodiment, a planarization layer which may be made of organic insulating material is formed and patterned to planarize the backplane substrate.

Figure 3A:
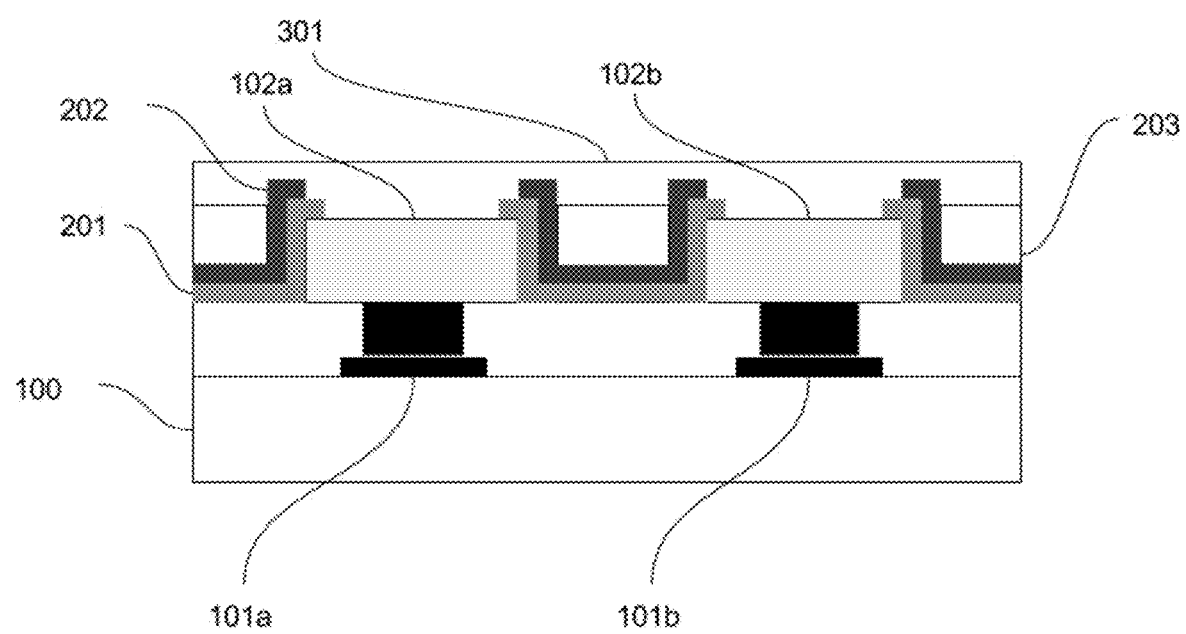
FIG. 3A shows a receiver substrate with contact pads, an array of transferred micro-devices attached to the receiver substrate, patterned conformal dielectric and reflective layers, a black matrix layer, and a transparent conductive layer deposited on the substrate.

Referring to FIG. 3A, a transparent conductive layer 301 may be conformally deposited on the substrate, covering the black matrix 203 and the top surface of micro LEDs 102. In some embodiments, the transparent electrode 301 may be 0.1-1 um thick layers of oxides, including but not limited to indium tin oxide (ITO) and Aluminum doped Zinc Oxide. In a case where the integrated assembly is a display structure, the transparent electrode 301 may be the common electrode of the micro LED devices 102.

Optionally, the reflective layer 202 may be used as a conductivity booster for the transparent electrode 301. In this case, part of the reflective layer may not be covered with black matrix 203, or other planarization layers, so that the transparent electrode layer 301 may connect to the reflective layer 202.

Figure 3B:
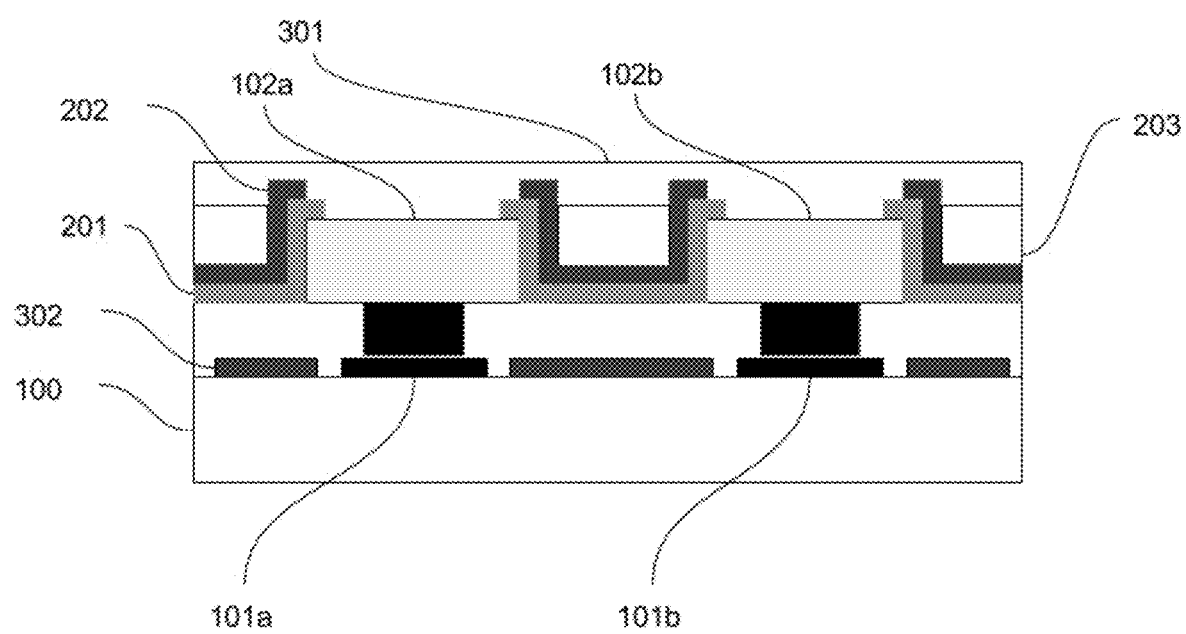
FIG. 3B shows a receiver substrate with an integrated array of transferred micro-devices attached to the receiver substrate and optical reflective components for light outcoupling enhancement.

In another embodiment shown in FIG. 3B, a reflective or other type of optical component 302 may be formed on the substrate 100 to enhance outcoupling of light produced by micro devices 102a and 102b. The common contact 301 is transparent to allow light output through this layer. These structures may be referred as top emission structures.

Figure 3C:
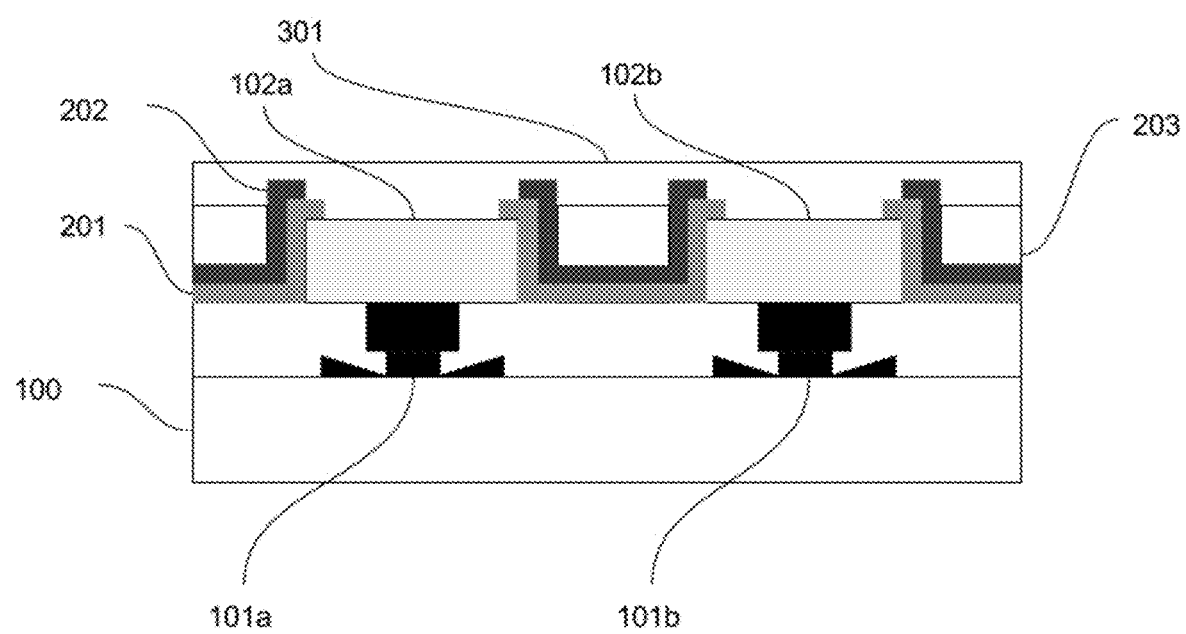
FIG. 3C shows a receiver substrate with an integrated array of transferred micro-devices attached to the receiver substrate and concave contact pads for light outcoupling enhancement.

Referring to FIG. 3C, the contact pad 101 may be formed to have a concave or other shaped structure to enhance the outcoupling of light produced by microdevices 102. The contact pad form is not limited to the concave form and may have other forms depending on the micro device light emission characteristics.

Figure 3D:
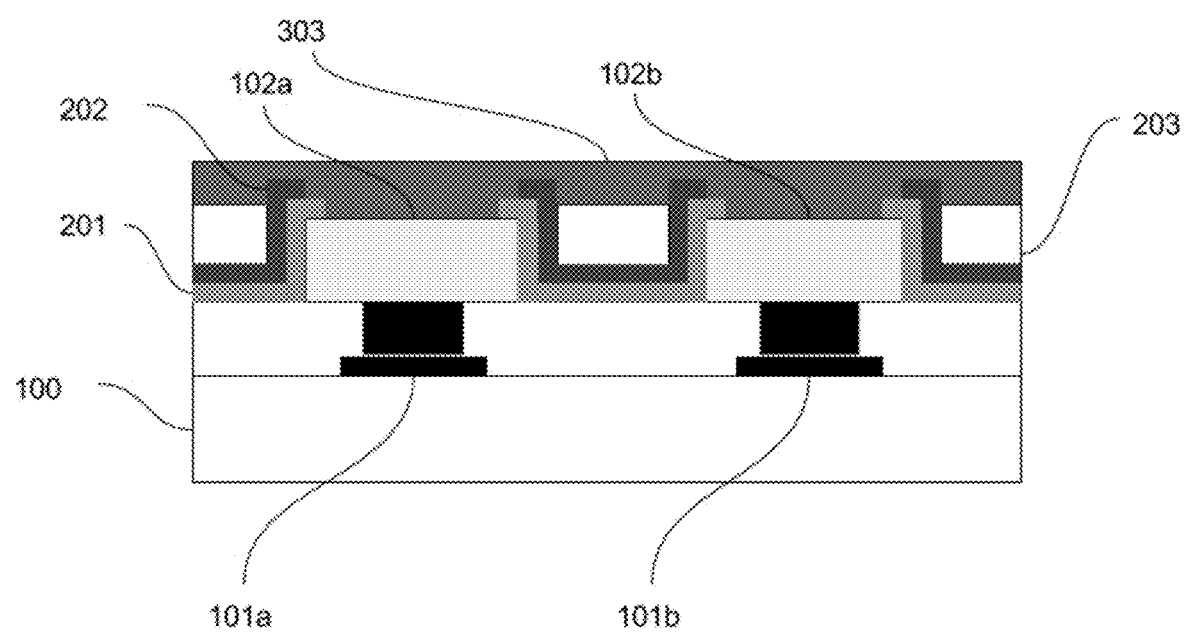
FIG. 3D shows a receiver substrate with an integrated array of transferred micro-devices attached to the receiver substrate in a bottom emission configuration.

In an embodiment, referring to FIG. 3D, the structure is designed to output light from the substrate. In these bottom emission structures, the substrate 100 may be transparent and the common electrode 303 is designed to be reflective for better light extraction.

Figure 3E:
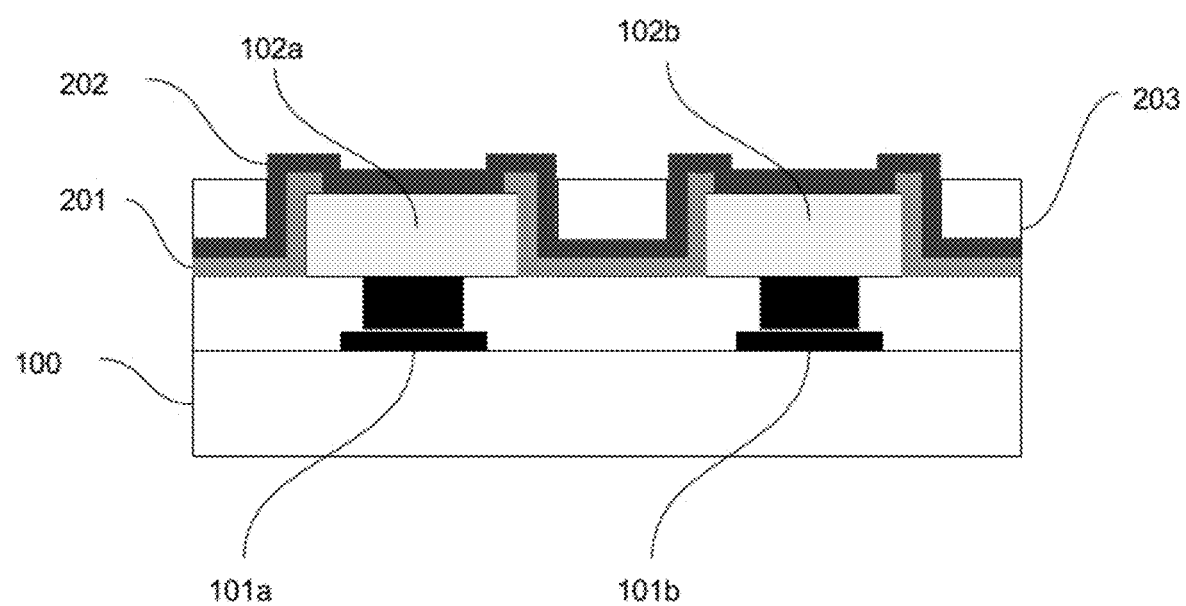
FIG. 3E shows a receiver substrate with an integrated array of transferred micro-devices attached to the receiver substrate.

In another embodiment shown in FIG. 3E, the reflective layer 202 may be extended to cover the micro devices and act as the common top electrode as well.

Figure 4A:
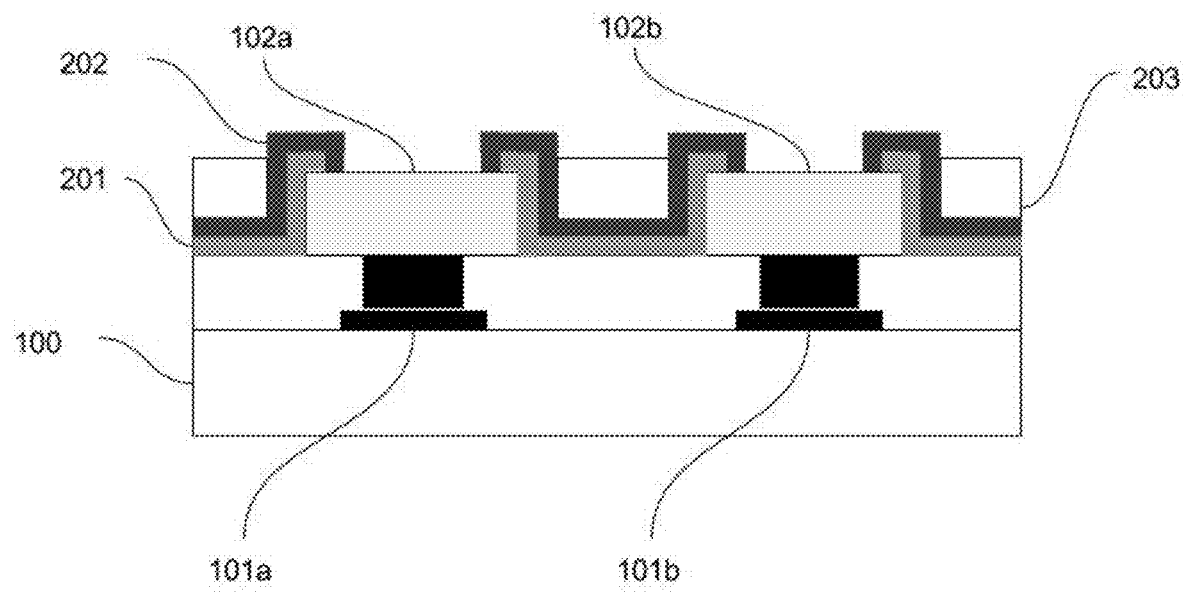
FIG. 4A shows a receiver substrate with transferred micro-devices, a conformal dielectric layer, and a connected reflective layer.

Referring to FIG. 4A, in another embodiment, the dielectric layer 201 may be deposited and patterned before forming the reflective layer 202. As shown in FIG. 4, this may allow a direct contact between micro LEDs 102 and the reflective layer 202 which may be used as a common top contact for the micro devices 102. Black matrix 203 or alternatively a planarization layer may be used.

Figure 4B:
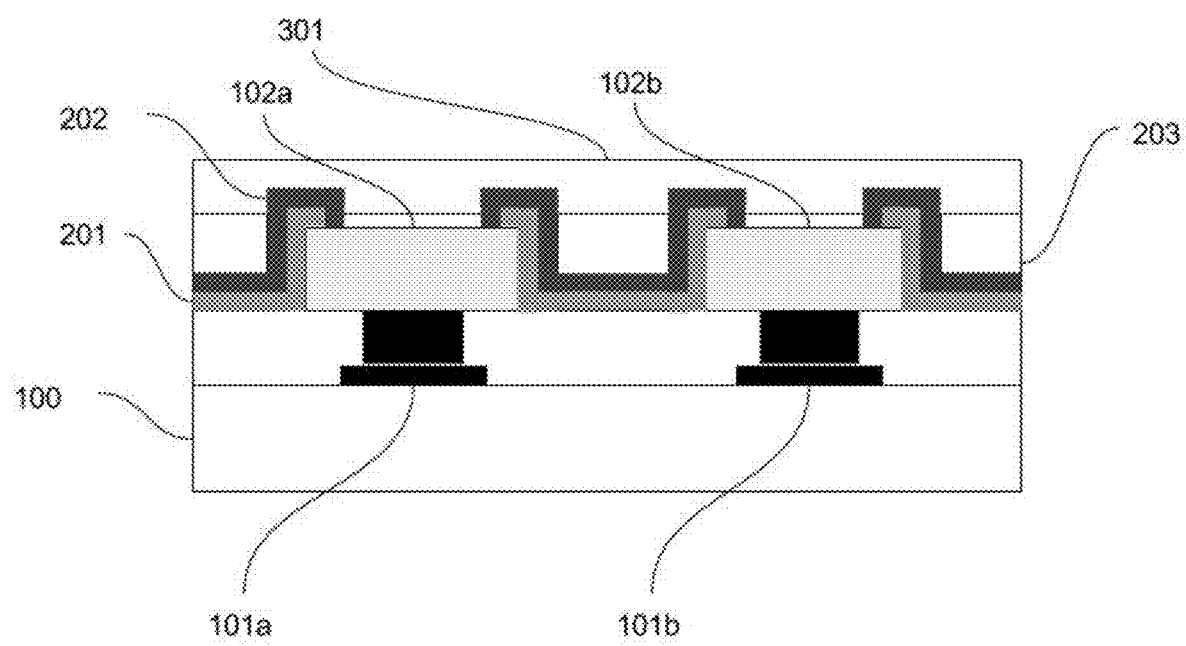
FIG. 4B shows a receiver substrate with transferred micro-devices, conformal dielectric layer, connected reflective layer, and a transparent conductive layer deposited on the substrate.

Referring to FIG. 4B, in other embodiments, a common transparent electrode 301 or/and other optical layers may be deposited on top of the substrate 100 to enhance conductivity and/or light out coupling.

Figure 5:
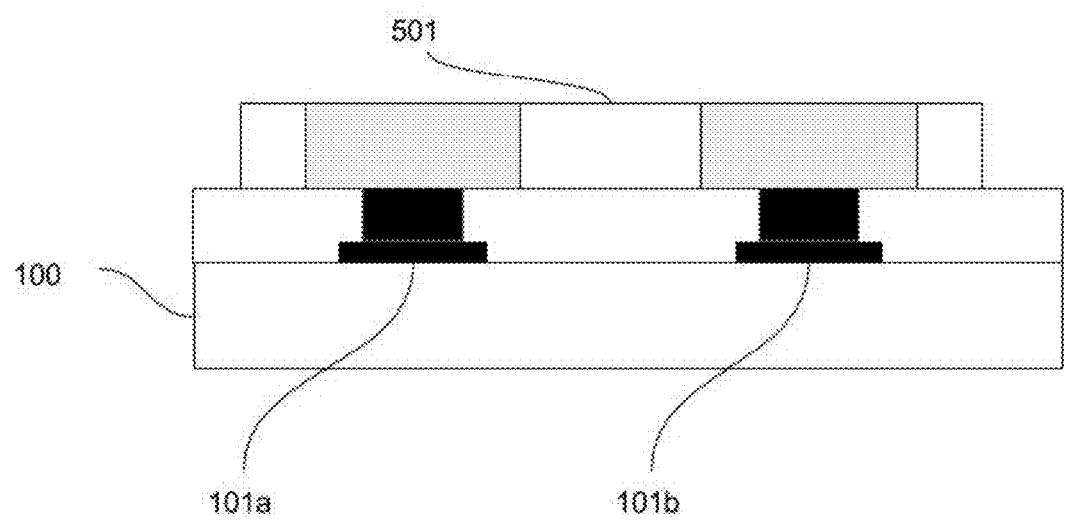
FIG. 5 shows a receiver substrate with transferred micro-devices and a patterned filler which defines the pixels (or sub-pixels).

One of the main challenges with micro optoelectronic devices is the empty space between adjacent micro devices. Display systems with this structural characteristic may create an image artifact called the "screen door effect." In one embodiment, the micro device sizes may be optically extended to be the same or larger than the micro device size. In one embodiment shown in FIG. 5, after transferring the array of micro devices 102 from the donor to the receiver substrate 100, transparent filler 501 is deposited and patterned to define the pixel (or sub-pixel). In one example, the filler size can be the smaller or the maximum size possible in a pixel (or sub-pixel) area. In another example, the filler size may be larger than the pixel or sup-pixel area. The filler may have a different or a similar shape as the pixel area on the system substrate. The processes illustrated in FIG. 3 and FIG. 4 may then be applied to improve the light extraction from the micro devices.

Figure 6A:
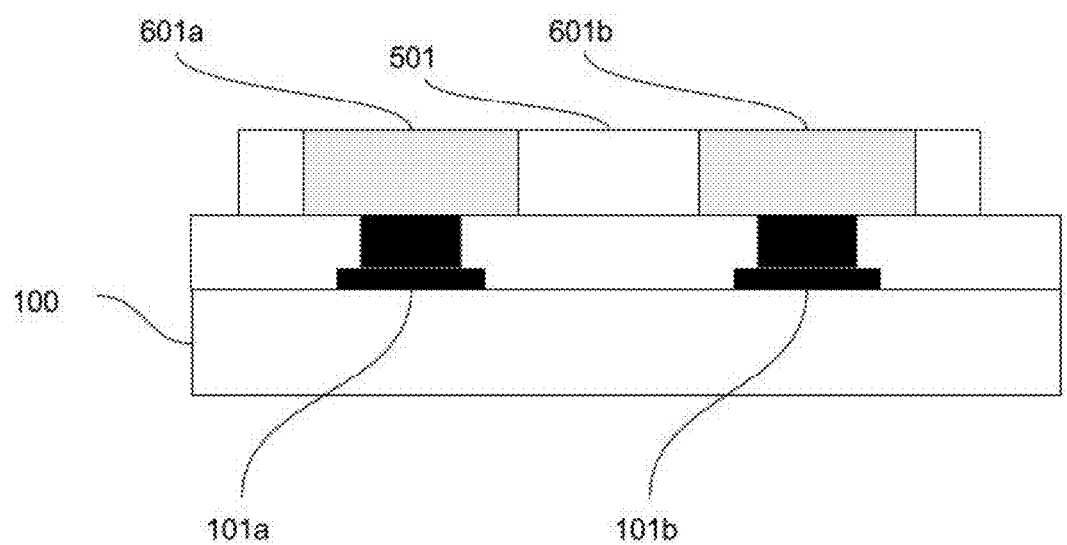
FIG. 6A shows a pixelated filler structure covering all sub-pixels in at least one pixel (for example covering both sub-pixels for a pixel made of two sub-pixels).
Figure 6B:
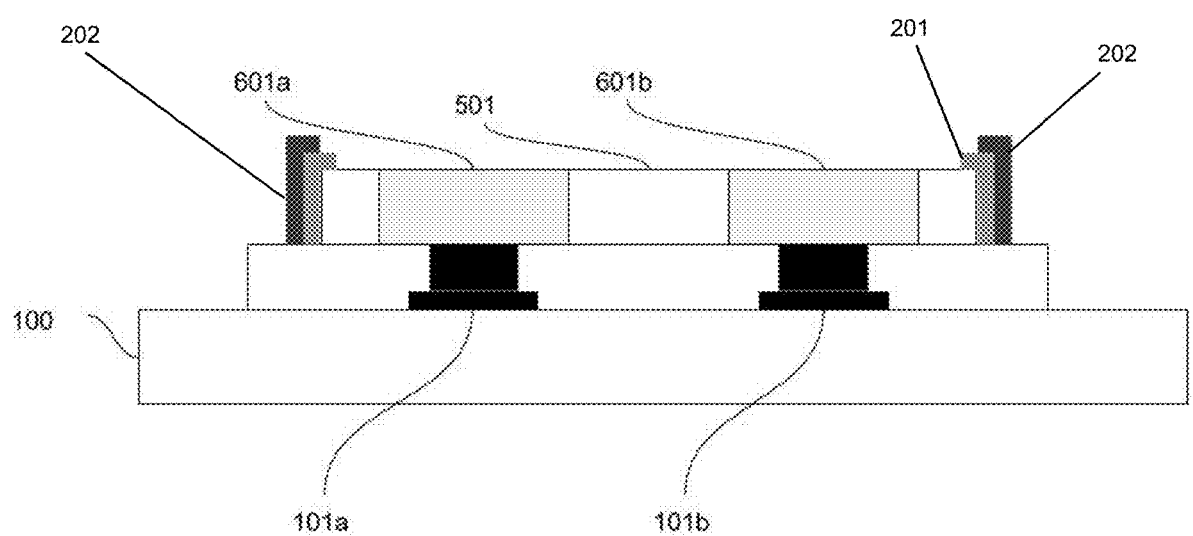
FIG. 6B shows a pixel made of two sub-pixels, a filler layer which is patterned to define the pixel, and patterned conformal dielectric and reflective layers around the pixel.
Figure 6C:
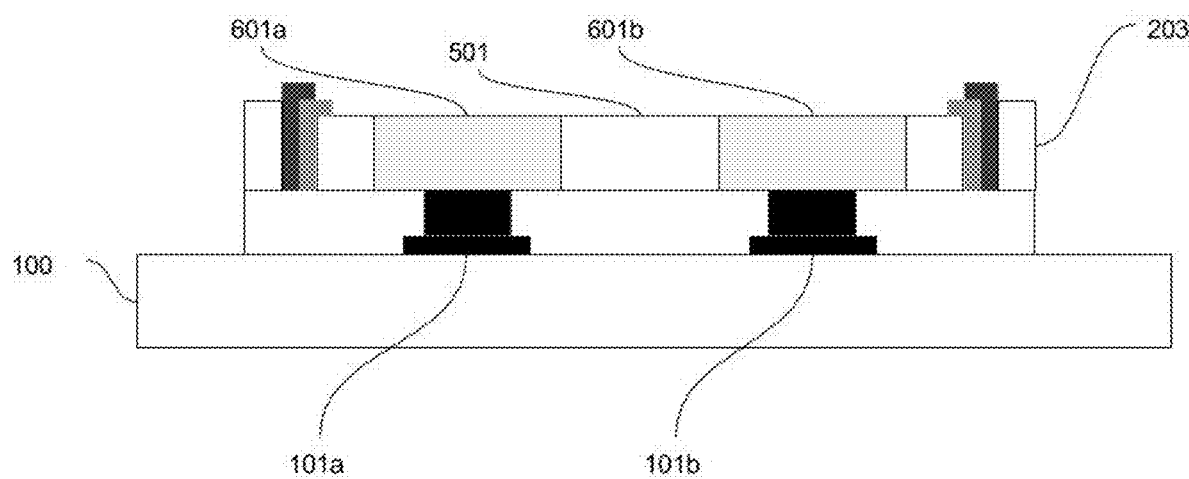
FIG. 6C shows a pixel made of two sub-pixels, a filler layer which is patterned to define the pixel, patterned conformal dielectric and reflective layers around the pixel, and a black matrix layer wrapped around the pixel.
Figure 6D:
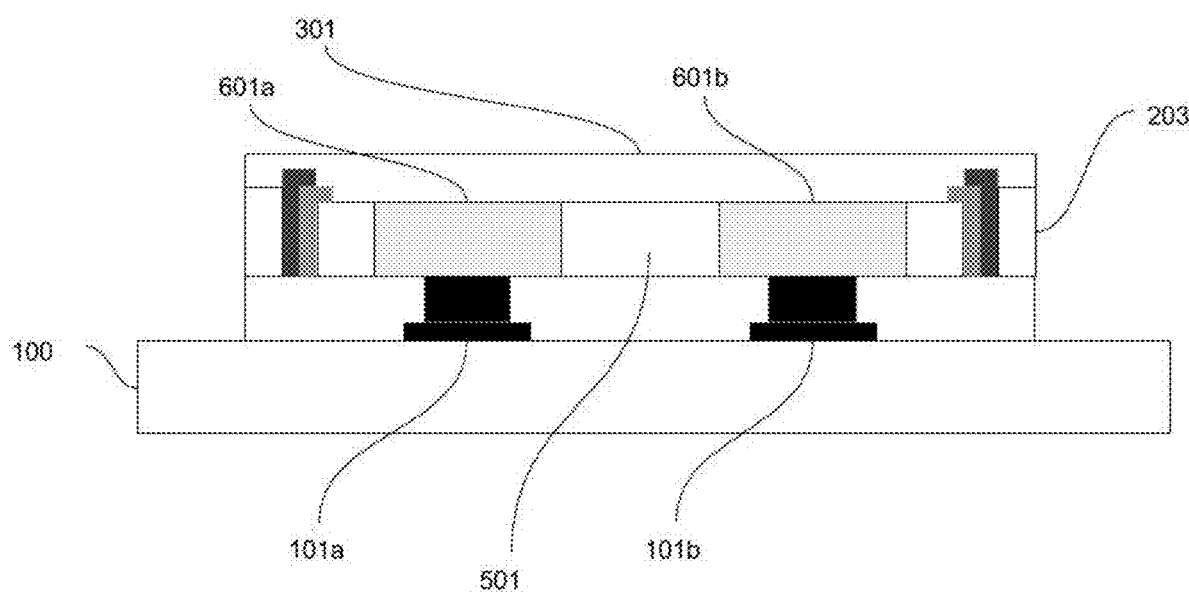
FIG. 6D shows a pixel made of two sub-pixels, a filler layer which is patterned to define the pixel, patterned conformal dielectric and reflective layers around the pixel, a black matrix layer wrapped around the pixel, and a transparent conductive layer deposited on the substrate.

Referring to FIG. 6A, in an embodiment where the pixel 601 is made of two sub-pixels 601a and 601b, the filler 501 is patterned to define the active area of the pixel 601 (active area being defined as the area from which the display emits light). Here, the active area can be smaller, larger, or the same size as the pixel (or sub-pixel) area. As shown in FIG. 6B, FIG. 6C, and FIG. 6D processes mentioned in FIG. 2 and FIG. 3 may be applied. This configuration manages the discoloration at the edges due to the separation between sub-pixels Referring to FIG. 6B, a dielectric layer 201 and a reflective layer 202 may be formed around and over pixel 601.

Referring also to FIG. 6C, a black matrix 203 may be formed between adjacent pixels and around each pixel to reduce the reflection of the ambient light.

Referring to FIG. 6D, a transparent conductive layer 301 may be deposited on the substrate, covering the black matrix 203 and the top surface of micro LEDs 601a and 601b.

Figure 6E:
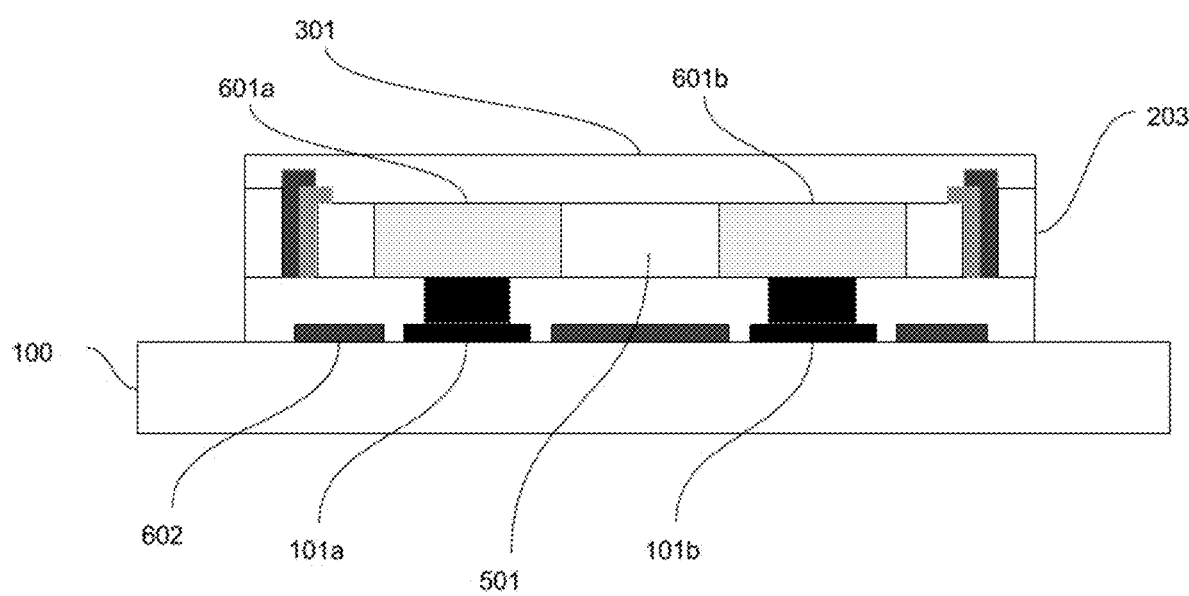
FIG. 6E shows a pixel made of two sub-pixels with reflective optical components on the receiver substrate for better light outcoupling.

In another embodiment shown in FIG. 6E, reflective or other optical component 602 may be formed on the substrate 100 to enhance outcoupling of light produced by micro devices 601a and 601b. The common contact 301 is transparent for the light to output through this layer. These structures may be referred to as top emission structures.

Figure 6F:
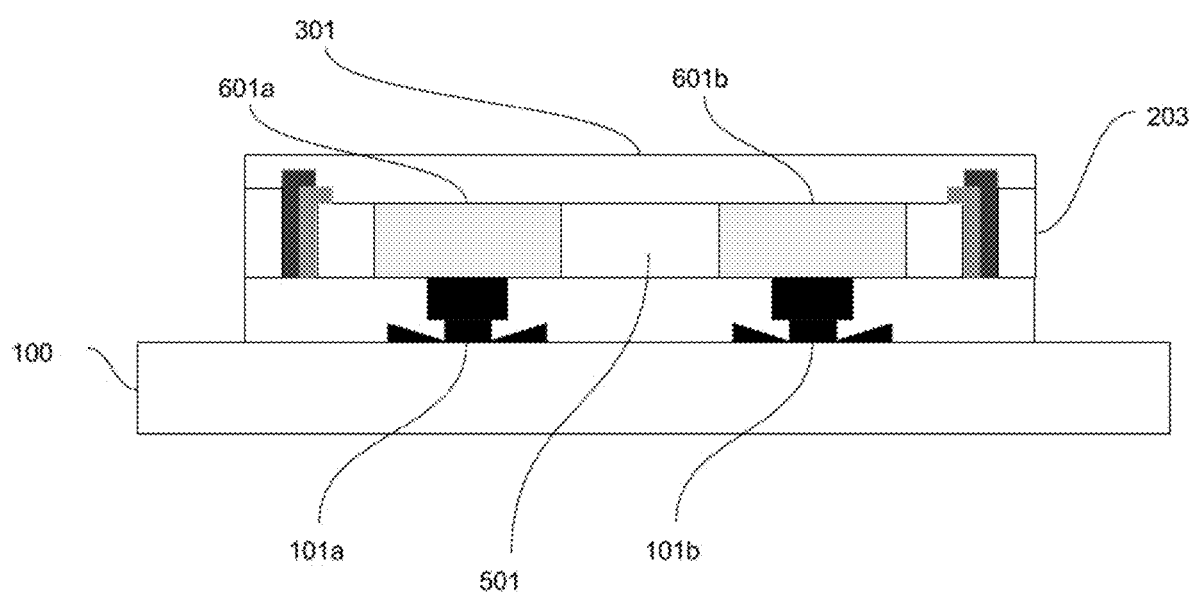
FIG. 6F shows a pixel made of two sub-pixels with concave contact pads on the receiver substrate.

Referring to FIG. 6F, the contact pad 101 may be formed to have a concave structure to enhance the outcoupling of light produced by micro devices 601. The contact pad form is not limited to the concave form and may have other forms depending on the micro device light emission characteristics.

Figure 6G:
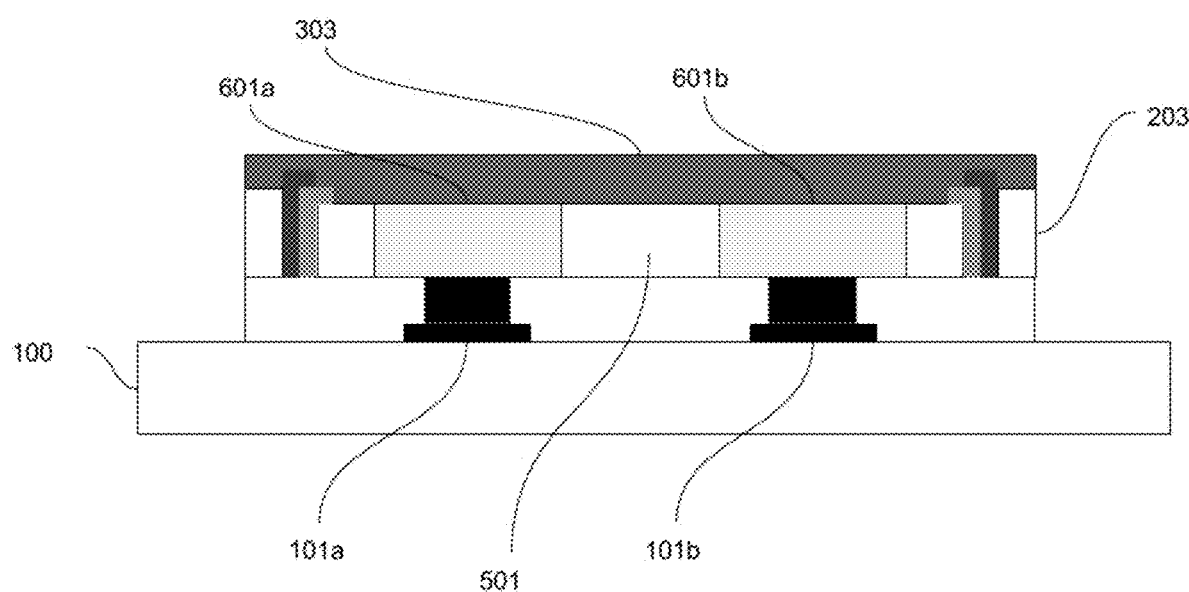
FIG. 6G shows a pixel made of two sub-pixels with a bottom emission configuration.

Referring to FIG. 6G, in another embodiment, the structure is designed to output light from the substrate. In these bottom emission structures, the substrate 100 may be transparent and the common electrode 303 is designed to be reflective for better light extraction.

Figure 6H:
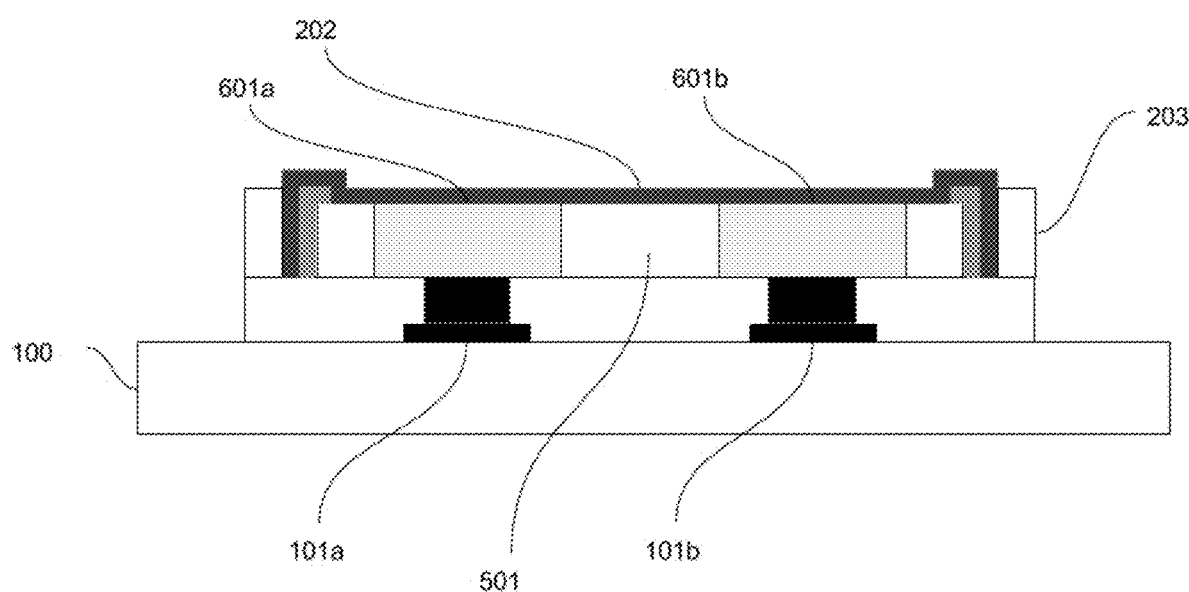
FIG. 6H shows a pixel made of two sub-pixels with a bottom emission configuration, a common top electrode, and side reflectors.

In another embodiment shown in FIG. 6H, the reflective layer 202 may be extended to cover the micro devices and act as the common top electrode as well.

In other embodiments, the aforementioned pixel definition structure can cover more than one pixel (or sub-pixel).

In another case, a reflective layer or the contact pads on the receiving substrate may be used to cover the receiving substrate and create a reflective area before transferring the micro devices for better light out coupling.

In all aforementioned embodiments, the reflective layer can also be opaque. In addition, the reflective layers can be used as one of the micro device electrodes or as one of the system substrate connections (electrode, signal, or power line). In another embodiment, the reflective layer can be used as a touch electrode. The reflective layers can be patterned to act as a touch screen electrode. In one case, they can be patterned in vertical and horizontal directions to form the touch screen crossing electrode. In this case, one can use a dielectric between vertical and horizontal traces.

Hybrid Structures

In another embodiment, a thin film electro-optical device is integrated into the receiver substrate after the micro device arrays have been transferred to the receiver substrate.

Figure 7:
FIG. 7 shows a receiver substrate with two contact pads.

FIG. 7 shows a receiver substrate 100 and contact pads 702 upon which the micro device arrays are transferred and into which the thin film electro-optical device is integrated in a number of hybrid structure embodiments.

Figure 8:
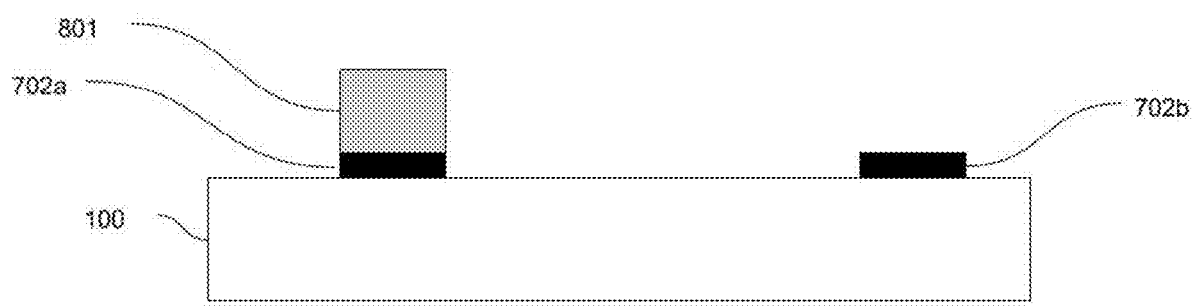
FIG. 8 shows a receiver substrate with a transferred micro device bonded to one of the contact pads.
Figure 9:
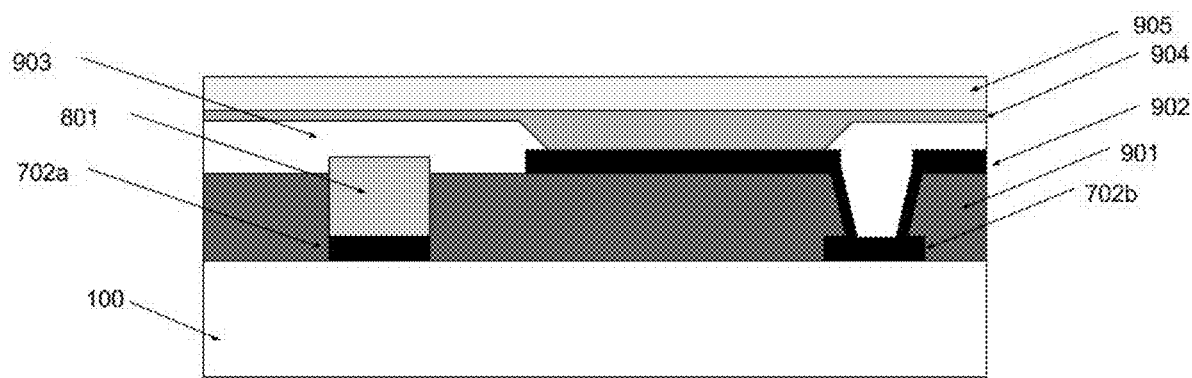
FIG. 9 shows the integration of a transferred micro-device with an electro-optical thin film device in a hybrid structure.

Referring to FIG. 8, micro device 801 may be transferred and bonded to the bonding pad 702a of the receiver substrate 100. In one case, as shown in FIG. 9 a dielectric layer 901 is formed over the substrate 100 to cover the exposed electrodes and conductive layers. Lithography and etching may be used to pattern the dielectric layer 901. Conductive layer 902 is then deposited and patterned to form the bottom electrode of the thin film electro-optical device 904. If there is no risk of unwanted coupling between bottom electrode 902 and other conductive layers in the receiver substrate, the dielectric layer 901 may be eliminated. However, this dielectric layer can act as planarization layer as well to offer better fabrication of electro-optical devices 904.

Still referring to FIG. 9, a bank layer 903 is deposited on the substrate 100 to cover the edges of the electrode 902 and the micro device 801. Thin film electro-optical device 904 is then formed over this structure. Organic LED (OLED) devices are an example of such a thin film electro-optical device which may be formed using different techniques such as but not limited to shadow mask, lithography, and printing patterning. Finally, the top electrode 905 of the electro-optical thin film device 904 is deposited and patterned if needed.

In an embodiment where the micro devices' 801 thickness is significantly high, cracks or other structural problems may occur within the bottom electrode 902. In these embodiments, a planarization layer may be used in conjunction with or without the dielectric layer 901 to address this issue.

Figure 10:
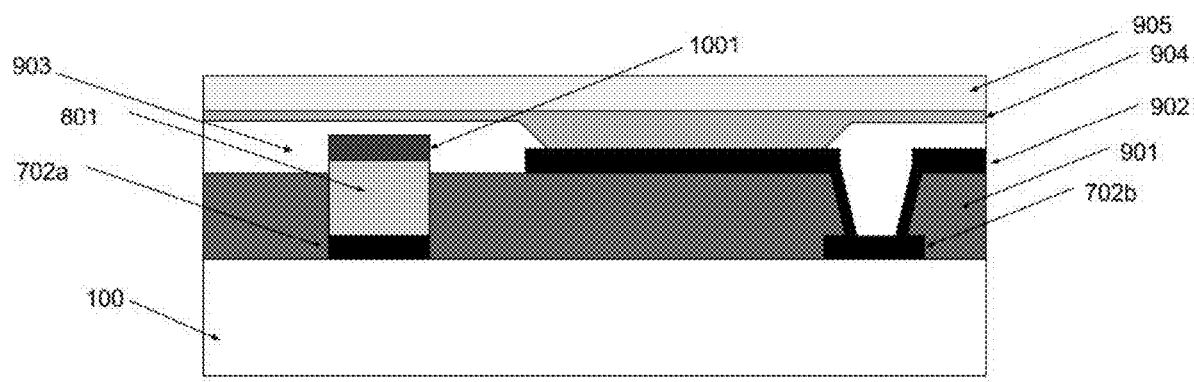
FIG. 10 shows another example of an integration of a transferred micro-device with an electro-optical thin film device in a hybrid structure.

In another embodiment shown in FIG. 10, the micro device 801 can have a device electrode 1001. This electrode can be common between other micro devices in the system substrate. In this case, the planarization layer (if present) and/or bank layer 903 covers the electrode 1001 to avoid any shorts between the electro-optical device 904 and device electrode 1001.

Figure 11:
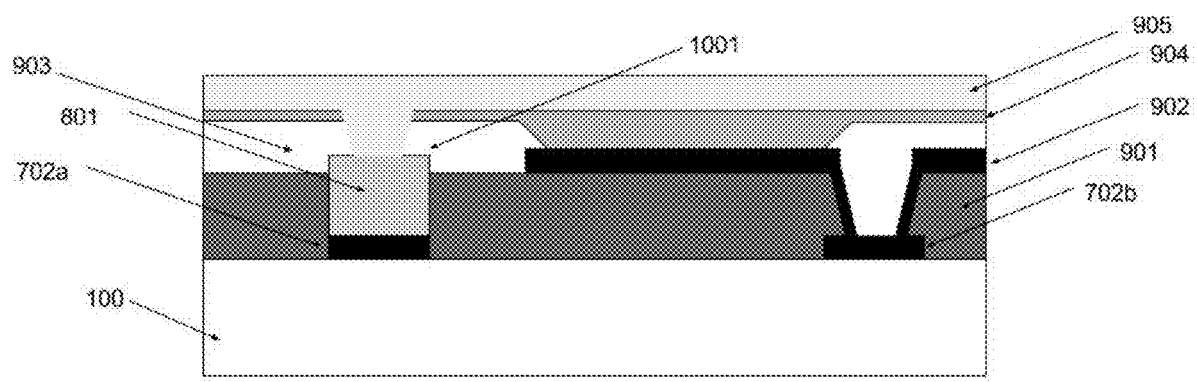
FIG. 11 shows an example of the integration of a transferred micro-device with an electro-optical thin film device in a hybrid structure with a common top electrode.

Referring to FIG. 11, in one embodiment, top electrode 905 of the thin film electro-optical device 904 may be connected to the micro device 801 through an opening in the planarization layer. In this case, the electro-optical device 904 may be formed selectively so that it is not covering this opening.

In another case, the bottom electrode of the micro device can be shared between the thin film electro-optical device and the transferred micro device.

Figure 12:
FIG. 12 shows an embodiment for the integration of a transferred micro-device with an electro-optical thin film device in a dual surface hybrid structure with both top and bottom transparent electrodes.
Figure 13A:
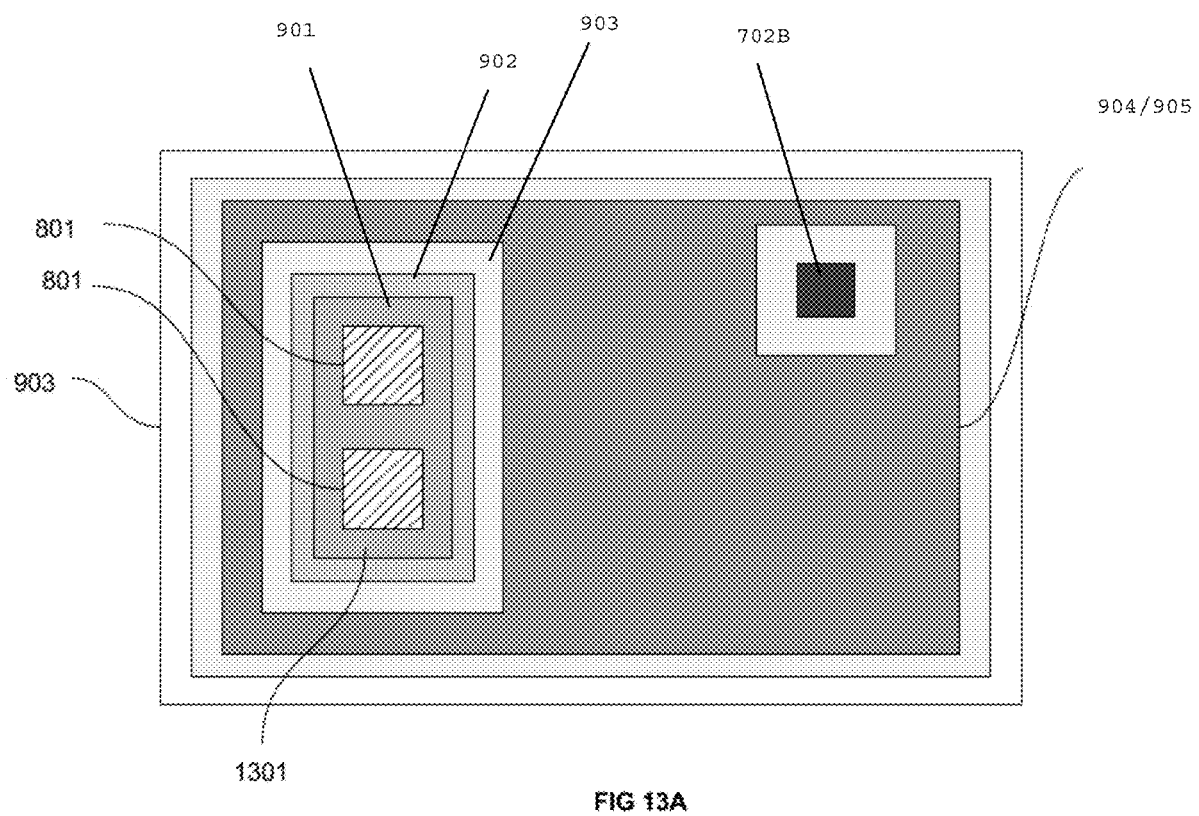
FIG. 13A shows another embodiment for a system substrate and an integrated micro device with thin film electro-optical device.

Referring to FIG. 12, in another example, the bottom electrode 902 of the thin film electro-optical device 904 can be expanded over the micro device 801. In case the micro device 801 needs to have a transparent path to the outside through its top electrode, the bottom electrode 902 (if not transparent) needs to have an opening over the micro device (for example as shown in FIG. 13A in association with another embodiment). In this case, the opening can be covered by the bank layer 903 as well. The opening is not limited to the specific structure illustrated in FIG. 12 and can be developed with different methods.

Still referring to FIG. 12, the micro device 801 can have a transparent path through the substrate 100 if electrode 702 is transparent. In a case where a transparent path is required through its top electrode, either the bottom electrode 902 and the micro device top electrode need to be transparent or there needs to be opening in the bottom electrode 902. FIG. 13A shows a layout structure where the bottom electrode 902 has an opening to allow a transparent path through the top electrode 905. There can be an opening 1301 in the bank layer 903 for the common top electrode 905. If there is no common top electrode 905 and if the bank layer 903 is transparent, the opening in the bank layer 903 is not needed. In some embodiments, if the top electrode 905 is also opaque, an opening in the top electrode 905 is also needed for top emission.

Figure 13B:
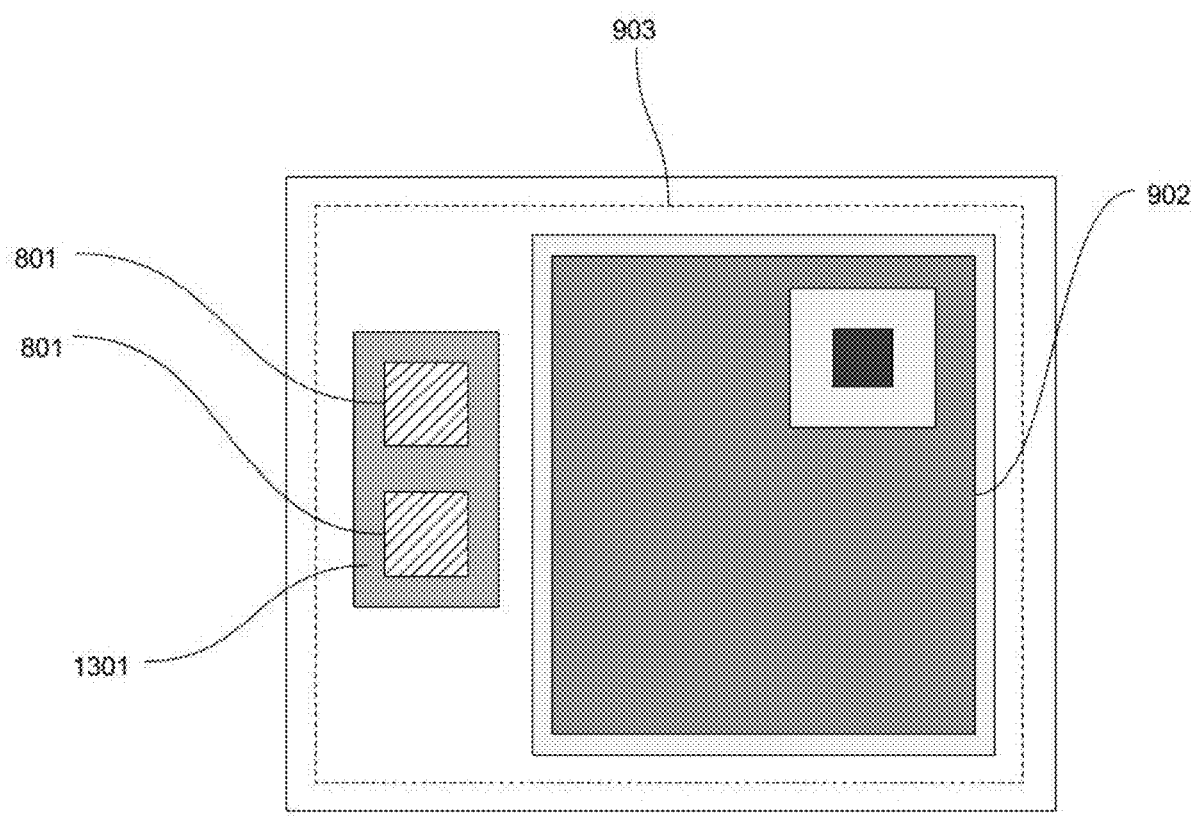
FIG. 13B shows another embodiment of a system substrate and an integrated micro device with a thin film electro-optical device.

Referring to FIG. 13B, in another embodiment, to provide a transparent path for the micro device 801, the bottom electrode 902 does not cover the micro device 801. There can be an opening 1301 in the bank layer 903 for a common top electrode. If there is no common electrode and the bank layer 903 is transparent, the opening in the bank layer 903 is not needed.

Figure 14A:
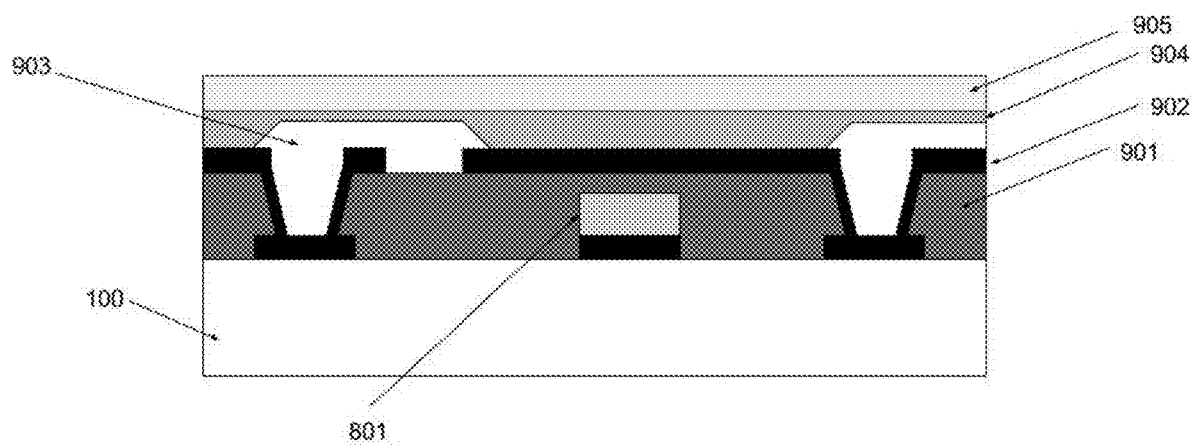
FIG. 14A shows a modified embodiment of a system substrate and an integrated micro device with two thin film electro-optical devices.
Figure 14B:
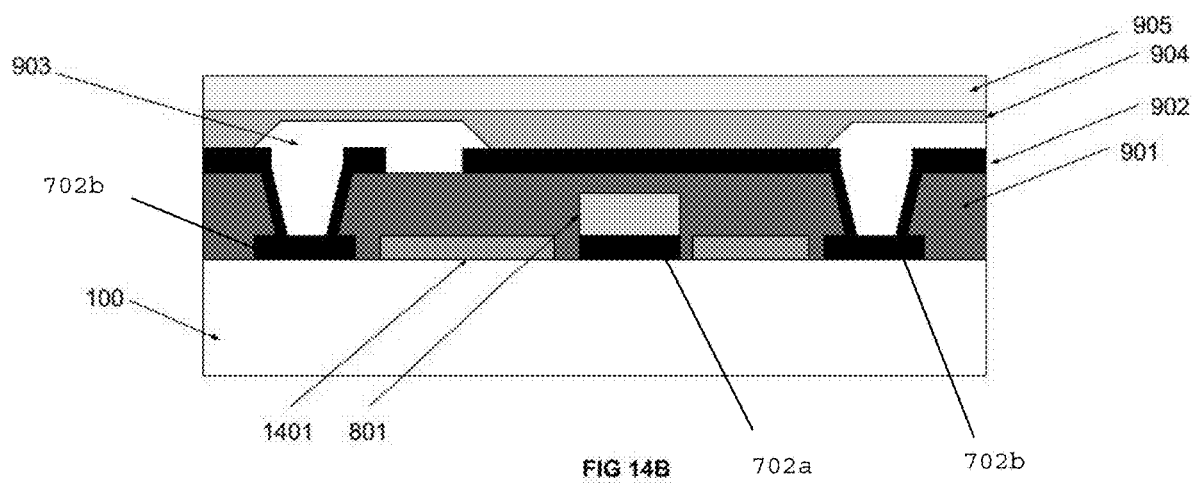
FIG. 14B shows an example of a system substrate and an integrated micro device with two thin film electro-optical devices and a reflective layer on the receiver substrate.

In another case, the contact of the thin film electro-optical device can be extended to act as reflective layer. As can be seen in FIG. 14A, the two side-by-side pixels can act to confine the light generated by the micro device 801 in the pixel. In another embodiment shown in FIG. 14B, the reflective layer 1401 on the surface of the substrate 100 can reflect more of the lights toward the top electrode 905. As a result, the out coupling of the light generated by the micro device 801 is enhanced. In this case, the best practice is either to make both top and bottom electrode of the thin film electro-optical device transparent, or make openings if these electrodes are opaque.

In another embodiment, the thin film electro-optical devices and micro devices can be on two opposite sides of the system substrate. In this case, the system substrate circuitry can either be on one side of the system substrate and connected to the other side through contact holes or, the circuits can be on both sides of the system substrate.

In another case, the micro device can be on one system substrate and the thin film electro-optical device on another system substrate. These two substrates may then be bonded together. In this case, the circuit can be on one of the system substrates or on both substrates. INTEGRATION This document also discloses various methods for the integration of a monolithic array of micro devices into a system substrate or selective transferring of an array of micro devices to a system substrate. Here, the proposed processes are divided into two categories. In the first category, the pitch of the bonding pads on the system substrate is the same as the pitch of the bonding pads of the micro devices. In the second category, bonding pads on the system substrate have a larger pitch compared to that of the micro devices. For the first category, three different schemes of integration or transfer are presented 1. Front-side Bonding
2. Back-side bonding
3. Substrate Through via Bonding.

Figure 15:
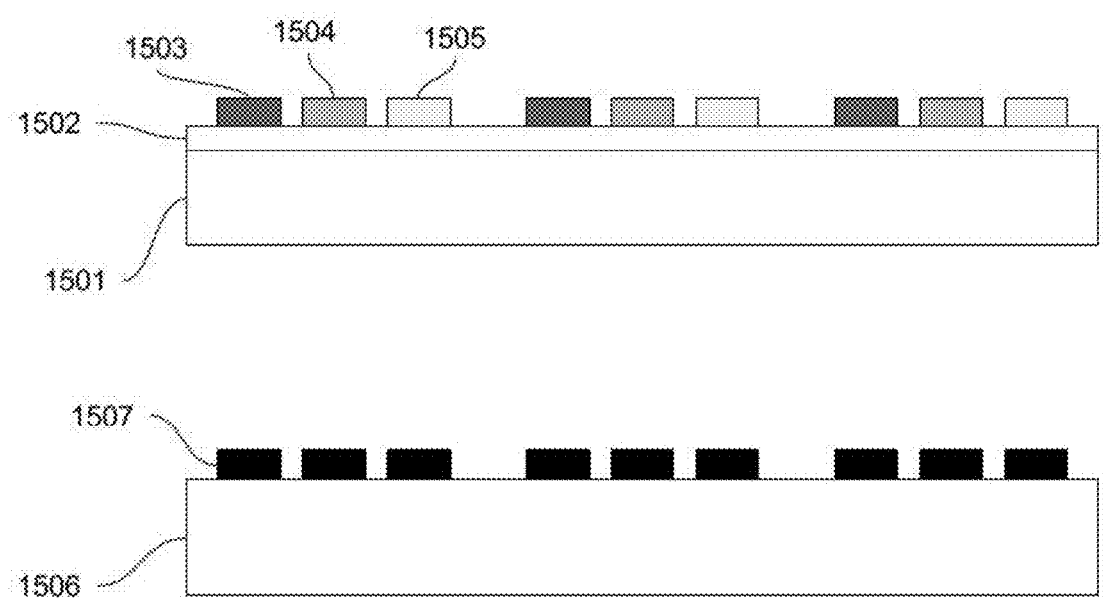
FIG. 15 illustrates a cross section of a system substrate and a micro device substrate.
Figure 16:
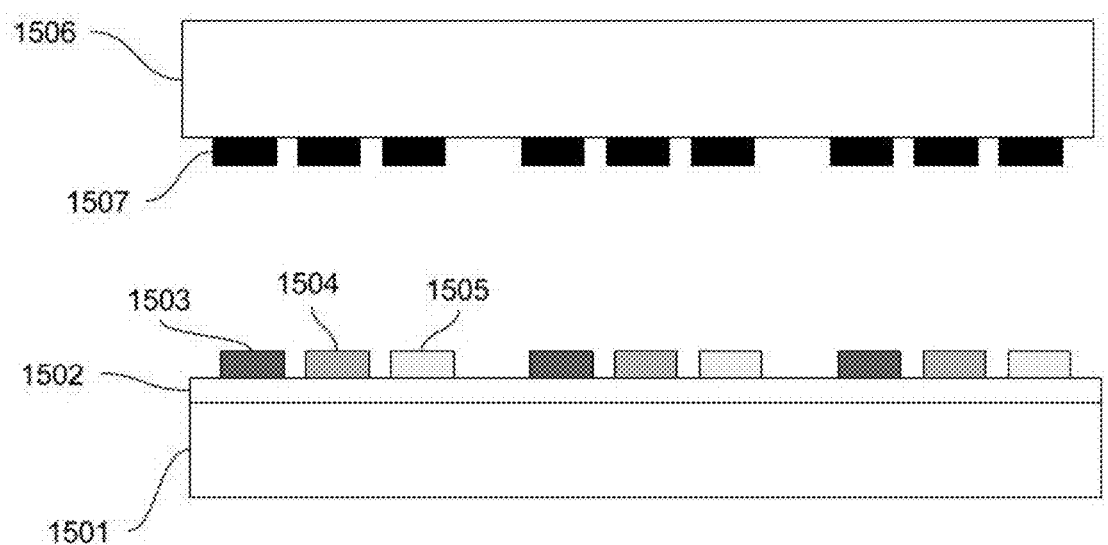
FIG. 16 shows the alignment step for a system substrate and a micro device substrate in a transfer process.
Figure 17:
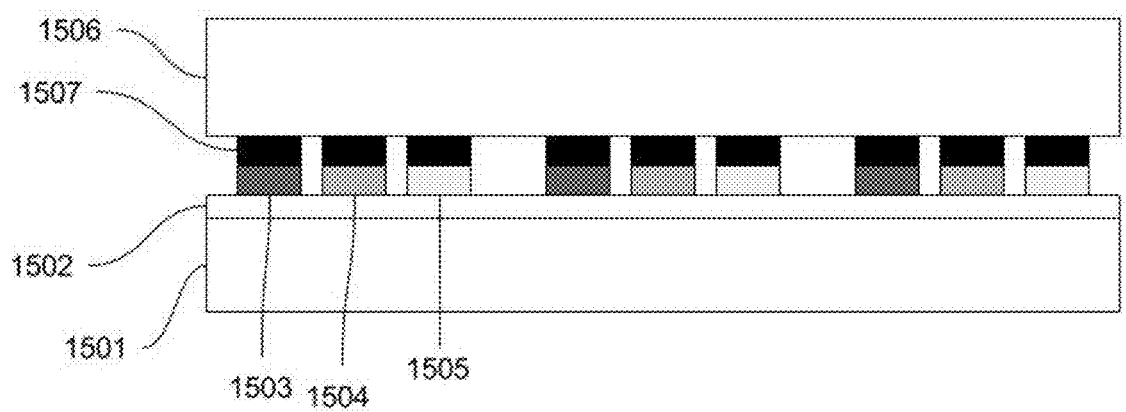
FIG. 17 shows the bonding step for a system substrate and a micro device substrate in a transfer process.
Figure 18:
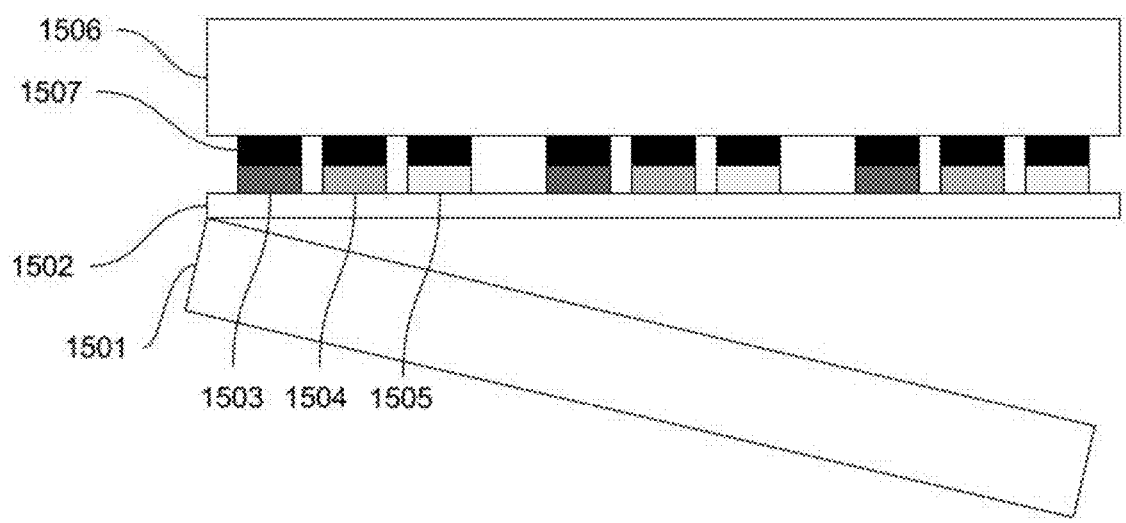
FIG. 18 shows the micro device substrate removal step for a system substrate and a micro device substrate in a transfer process.
Figure 19:
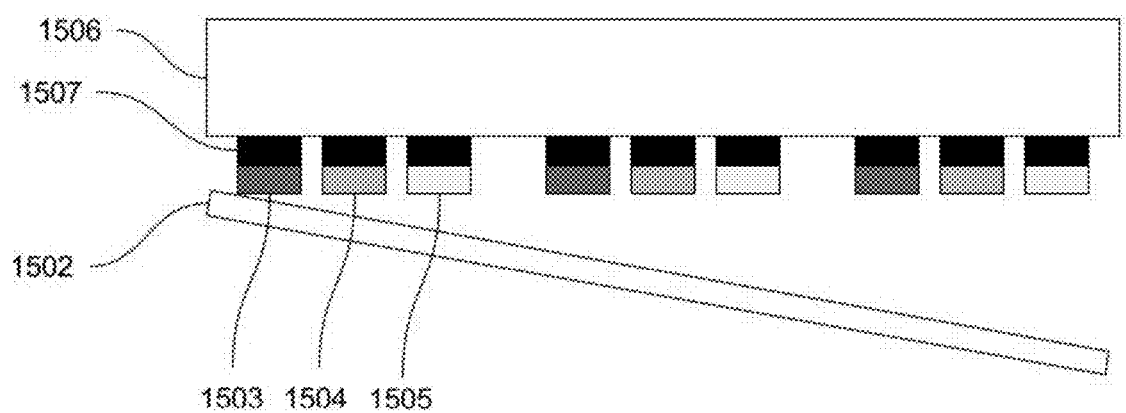
FIG. 19 shows the sacrificial layer removal step for a system substrate and a micro device substrate in a transfer process.
Figure 20:
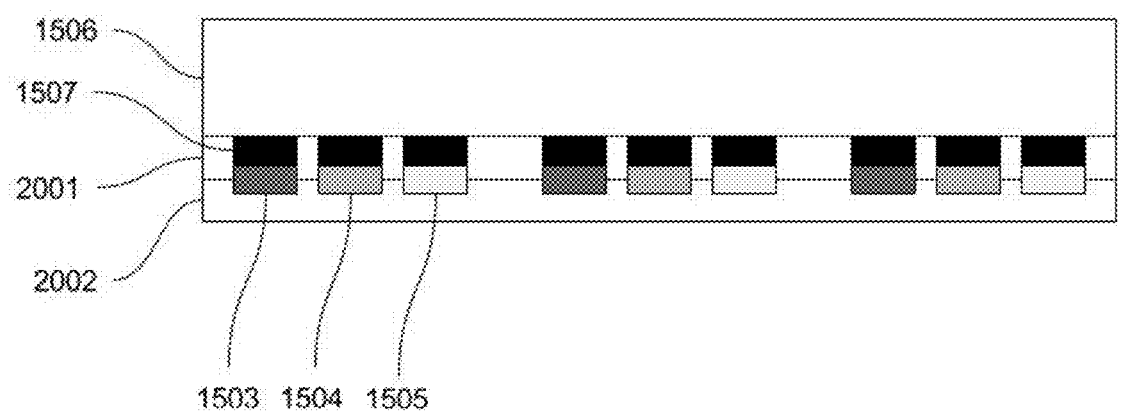
FIG. 20 shows the common electrode formation step for a system substrate and a micro device substrate in a transfer process.

In this embodiment micro-devices may be of the same type or different types in terms of functionality. In one embodiment, micro-devices are micro-LEDs of the same color or of a number of different colors (e.g., Red, Green, and Blue), and the system substrate is the backplane, controlling individual micro-LEDs. Such multi-color LED arrays are fabricated directly on a substrate or transferred to a temporary substrate from the growth substrate. In one example shown in FIG. 15, RGB micro-LED devices 1503, 1504, and 1505 were grown on a sacrificial/buffer layer 1502 and the substrate 1501. In one case, the system substrate 1506 having contact pads 1507 can be aligned (FIG. 16) and bonded to the micro device substrate 1501 as shown in FIG. 17. After removing the micro-device substrate 1501 (FIG. 18) and sacrificial/buffer layer 1502 (FIG. 19), a filler dielectric coating 2001 (e.g., Polyimide resist) may be spin-coated/deposited on the integrated sample (FIG. 20). This step may be followed by an etching process to reveal the tops of the micro-LED devices. In the case of micro-LED devices, a common transparent electrode 2002 may be deposited on the sample. In another embodiment, a top electrode may be deposited and patterned to isolate micro devices for subsequent processes.

Figure 21:
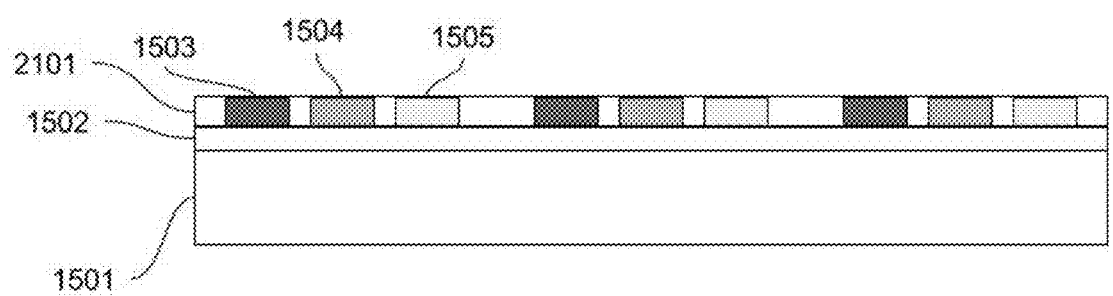
FIG. 21 is a cross section of a micro device substrate with a filler layer(s).
Figure 22:
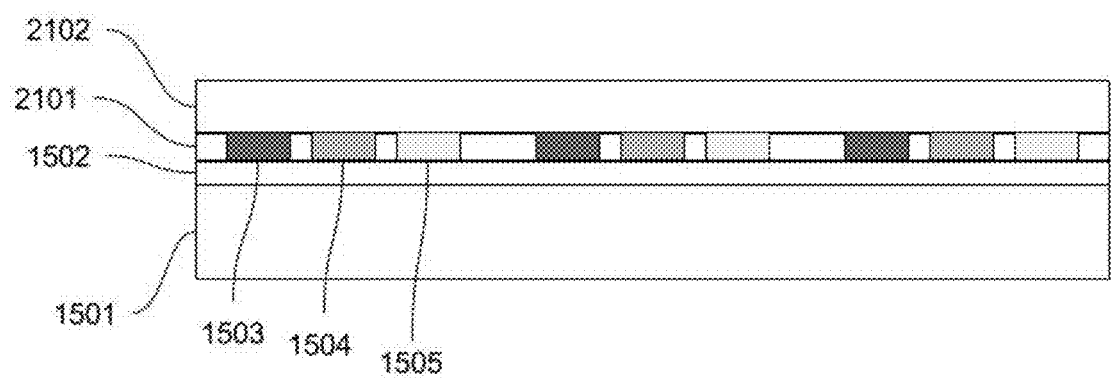
FIG. 22 is a cross section of a micro device substrate covered with a support layer.
Figure 23:
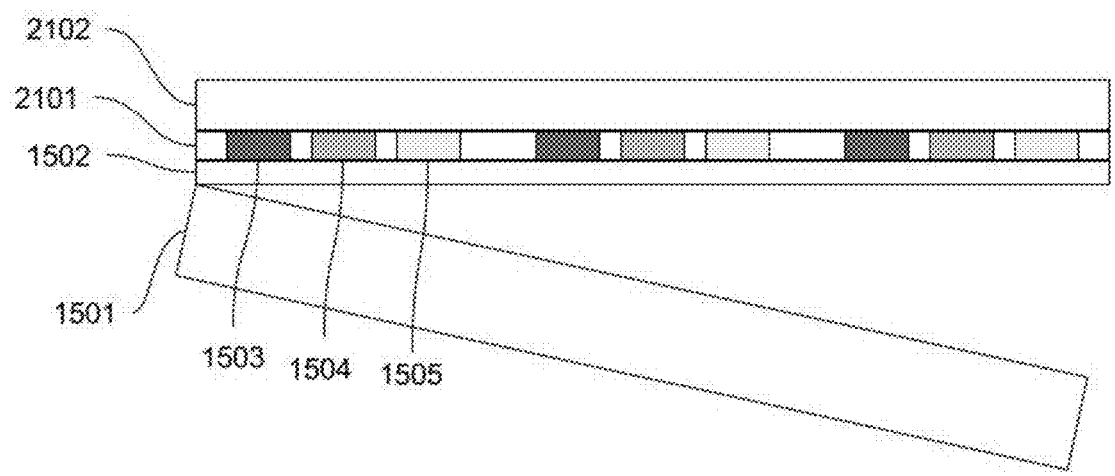
FIG. 23 shows the micro device substrate removal step for a micro device substrate in a transfer process.
Figure 24A:
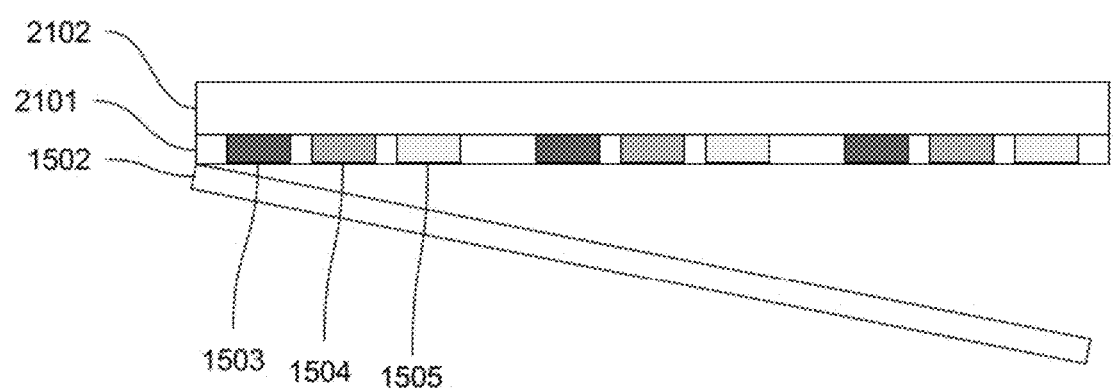
FIG. 24A shows the sacrificial/buffer layer removal step for a micro device substrate in a transfer process. A system substrate with contact pads is shown as well.
Figure 24B:
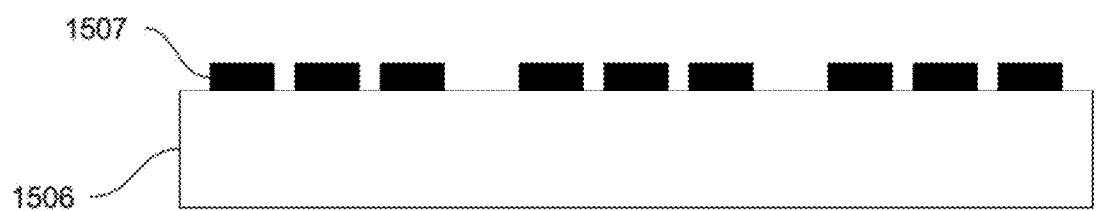
FIG. 24B shows the exposed micro devices after removal of the sacrificial/buffer layer.
Figure 25:
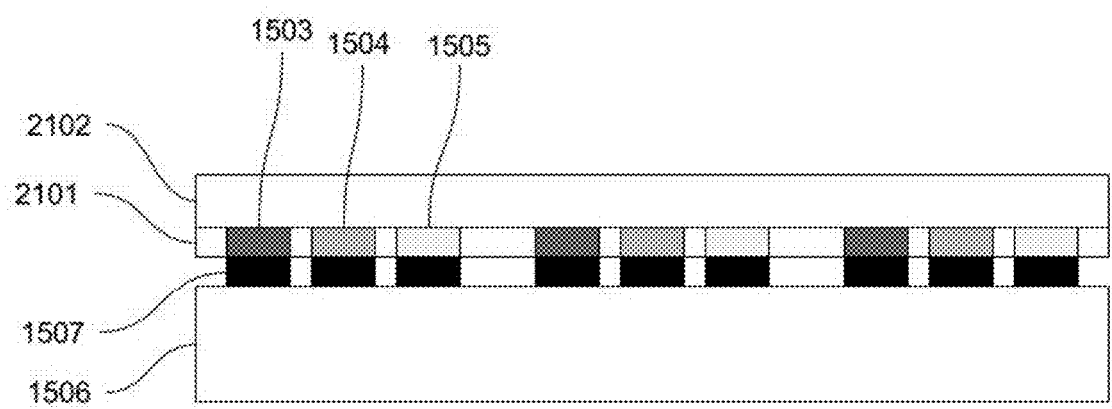
FIG. 25 shows the bonding step for a system substrate and a micro device substrate in a transfer process.
Figure 26A:
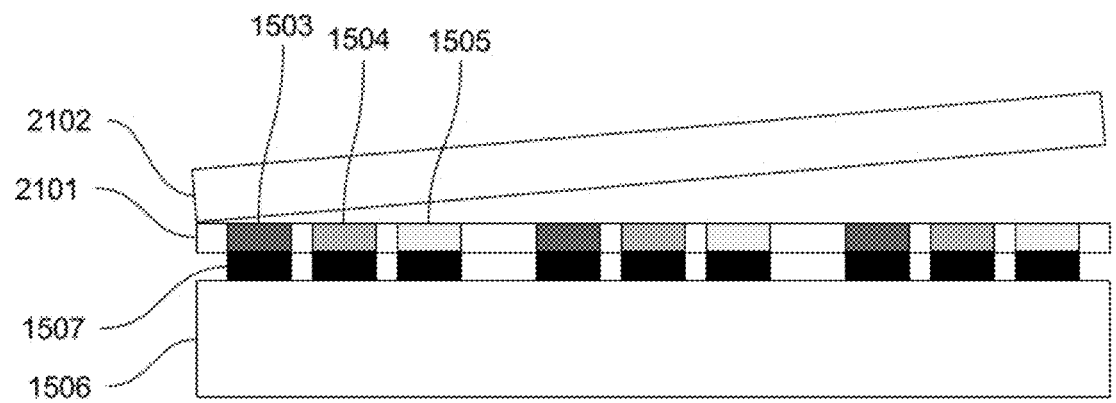
FIG. 26A shows the supporting layer removal step for a micro device substrate in a transfer process. A system substrate with contact pads and transferred micro devices is shown as well.
Figure 26B:
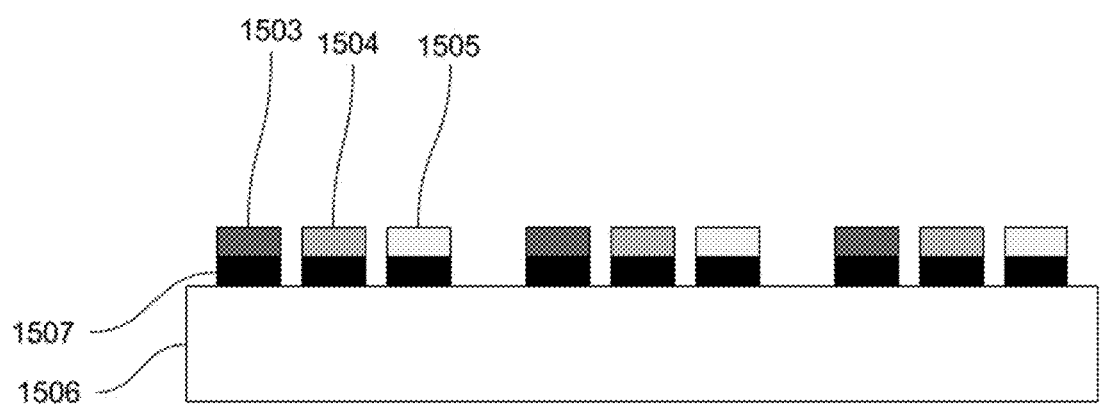
FIG. 26B shows the exposed micro devices after removal of the supporting layer and the filler layer.

In another embodiment, as shown in FIG. 21 the micro devices 1503, 1504, and 1505 are grown on a buffer/sacrificial layer 1502. A dielectric filler layer 2101 is deposited/spin-coated on the substrate to fully cover the micro devices. In one example illustrated in FIG. 21, this step is followed by an etching process to reveal the tops of the micro devices 1503, 1504, and 1505 to form the top common contact and seeding layer for subsequent processes (e.g. electroplating). Referring to FIG. 22, a thick mechanical supporting layer 2102 is then deposited, grown or bonded on the tops of the sample. Here, the filler layer 2101 can be a black matrix layer or a reflective material. Also, before depositing the mechanical support, one can deposit an electrode (either as a patterned or a common layer). The mechanical support layer is then deposited. In the case of optoelectronic devices such as LEDs, the mechanical support layer needs to be transparent. As shown in FIG. 23 and FIG. 24, the micro device substrate 1501 or sacrificial/buffer layer is then removed using various processes such as laser lift-off or etching. In one case, the thickness of the substrate is initially reduced to a few micrometers by processes such as but not limited to deep reactive ion etching (DRIE). The remaining substrate then is removed by processes such as but not limited to a wet chemical etching process. In this case, the buffer/sacrificial layer 1502 may act as an etch-stop layer to ensure a uniform etched sub-surface and to avoid any damage to the micro devices. After removing the buffer layer 1502 as shown in FIG. 24, another etching (e.g., RIE) is performed to expose the micro devices. One may deposit and pattern a metallic layer to serve as the upper contact and bond pads for the micro-devices if they haven't been formed during the micro device fabrication. The system substrate 1506 having contact pads 1507 can then be aligned and bonded to the micro device array as shown in FIG. 25. Depending on the type and functionality of the micro devices, the mechanical supporting layer 2102 and filler layer 2101 may be then removed as shown in FIG. 26A and FIG. 26B.

In another embodiment, through substrate vias are implemented to make contacts to the back of the micro devices.

Figure 27:
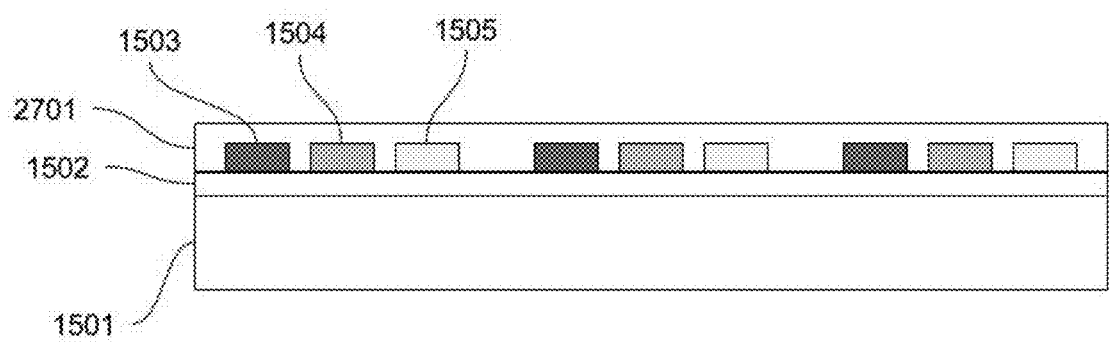
FIG. 27 is a cross section of a micro device substrate covered with a filler layer.

Referring to FIG. 27, in one embodiment, the micro devices 1503, 1504, and 1505 may be multicolor micro-LEDs grown on an insulating buffer layer 1502. This buffer layer may function as an etch-stop layer as well. A dielectric layer 2701 is deposited as a filler layer.

Figure 28A:
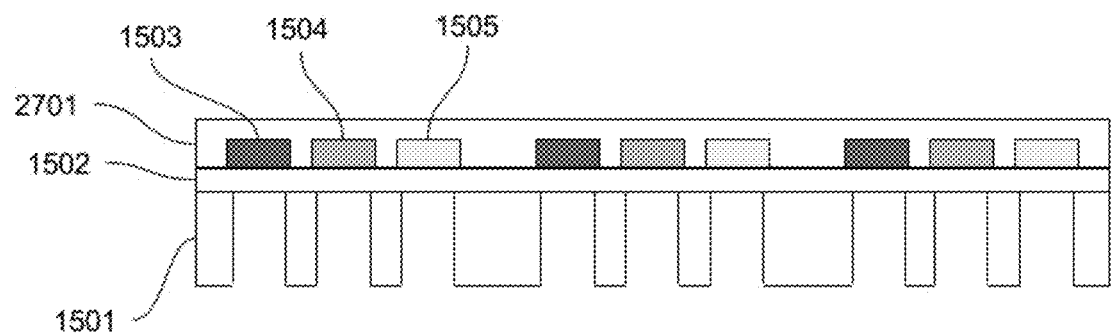
FIG. 28A is a cross section of a micro device substrate with via holes in the substrate and the sacrificial layer.
Figure 28B:
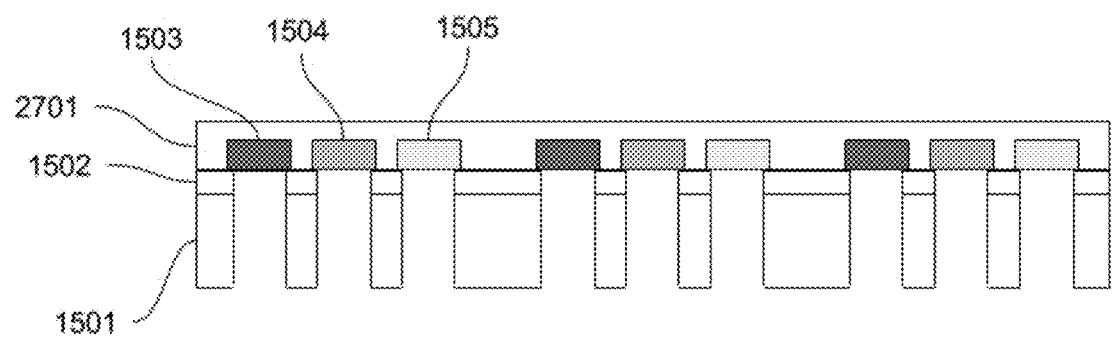
FIG. 28B is the cross section shown in FIG. 28A, after removal of the buffer layer.

Referring to FIG. 28A and FIG. 28B, using processes such as but not limited to photolithography, patterns are formed on the backside of the substrate 1501. In one embodiment, a method such as DRIE is used to make through substrate holes in the substrate 1501. Buffer layer 1502 which may act as an etch-stop layer may be removed using for example a wet-etch process, as illustrated in FIG. 28B.

Figure 29:
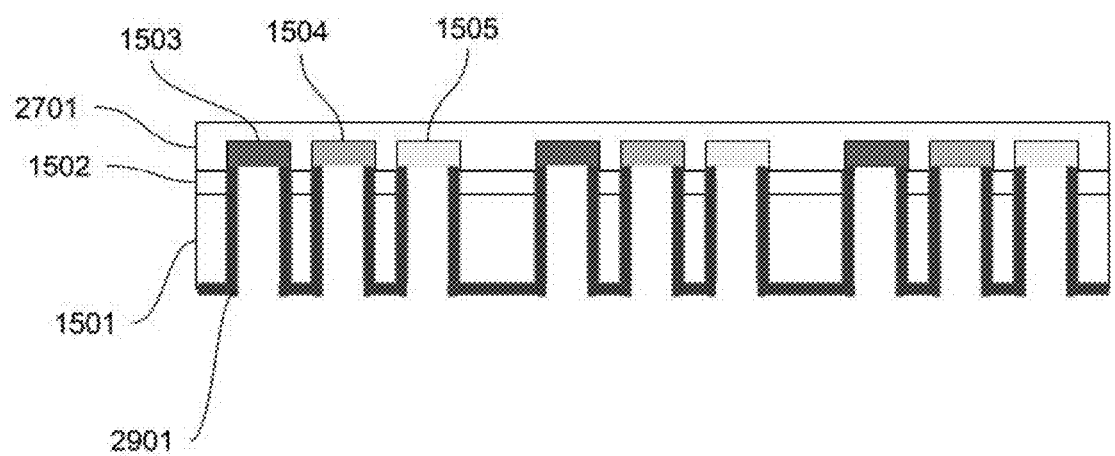
FIG. 29 is a cross section of a micro device substrate with via holes in the substrate and the sacrificial layer covered by an insulating layer.

Referring to FIG. 29, an insulating film 2901 is deposited on the back of the substrate 1501. This insulating layer 2901 may be partially removed from back side of the micro devices 1503, 1504, and 1505 to allow formation of electrical contacts to these micro devices.

Figure 30:
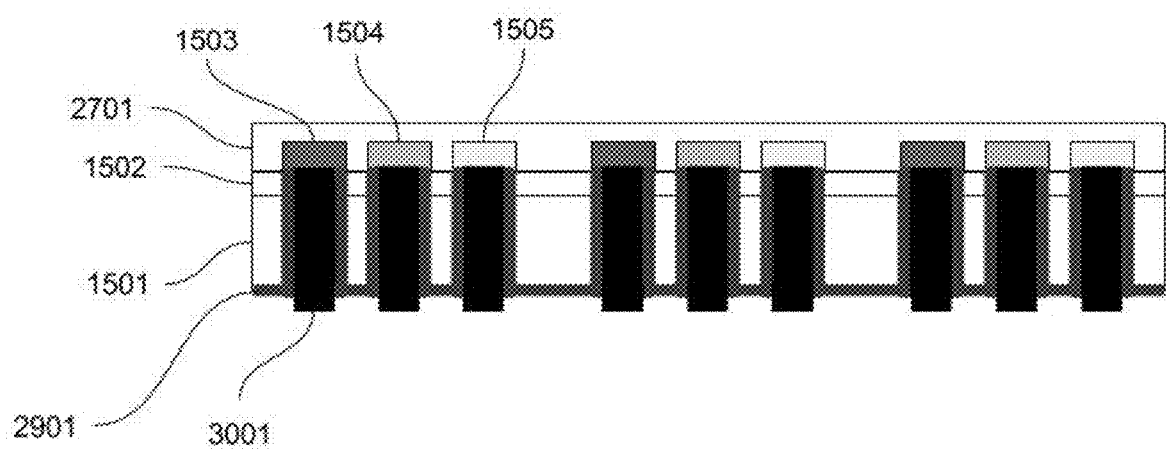
FIG. 30 is a cross section of a micro device substrate with a conductive layer filled via holes in the substrate and the sacrificial layer.

Referring to FIG. 30, the through holes are filled with a conductive material 3001 using processes such as but not limited to electroplating. Here, the vias may act as the micro device contacts and bonding pads.

Figure 31:
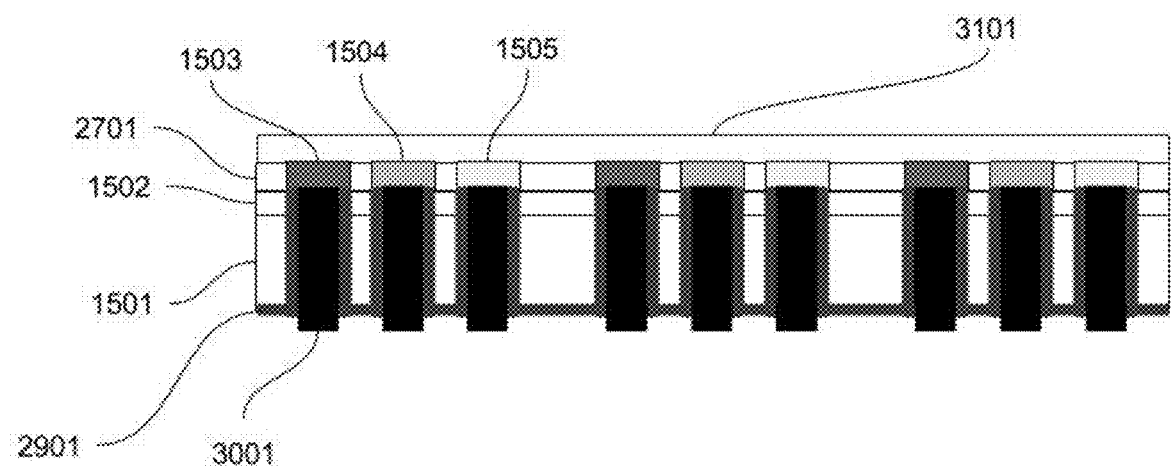
FIG. 31 is a cross section of a micro device substrate with a common top electrode.

As illustrated in FIG. 31, a common front contact 3101 of the micro devices 1503, 1504, and 1505 is formed by performing an etching process (e.g., using RIE) to reveal the tops of the micro-devices followed by the deposition of a transparent conductive layer to form the front contact 3101.

Figure 32:
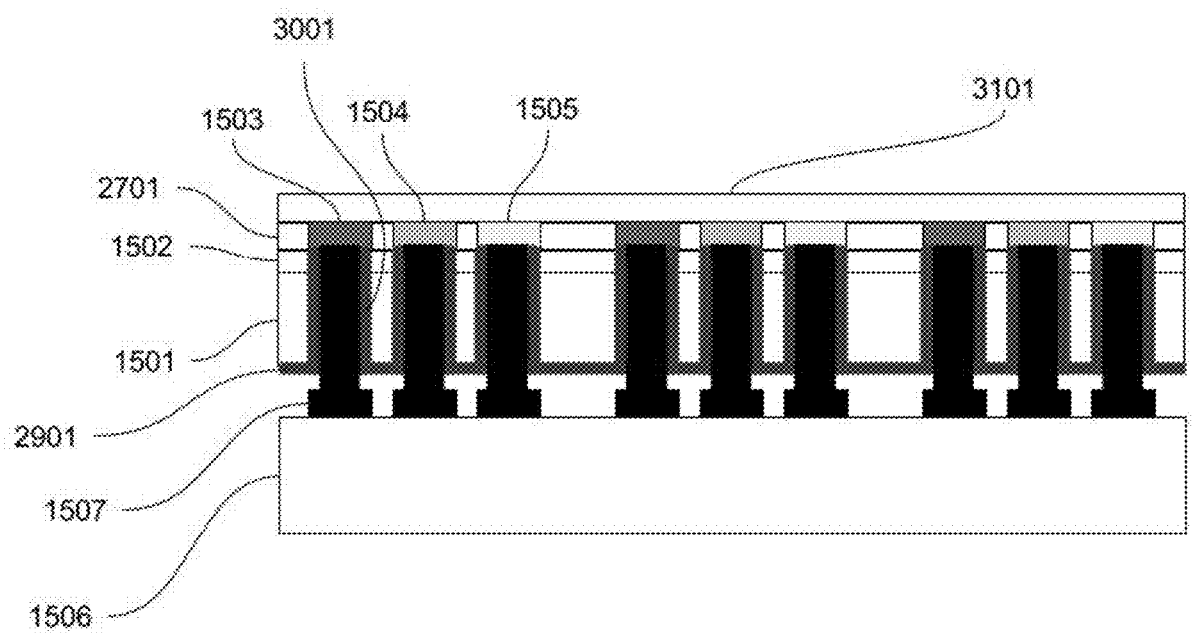
FIG. 32 is a cross section of an integrated system substrate with a common top electrode.

Referring to FIG. 32, the micro device substrate 1501 is then aligned and bonded to the system substrate 1506 having contact pads 1507 which in this example may be a backplane controlling individual devices.

In another embodiment, micro devices have been fabricated on a substrate with arbitrary pitch length to maximize the production yield. For example the micro devices may be multi-color micro-LEDs (e.g., RGB). The system substrate for this example may be a display backplane with contact pads having a pitch length different than those of the micro-LEDs.

Figure 33A:
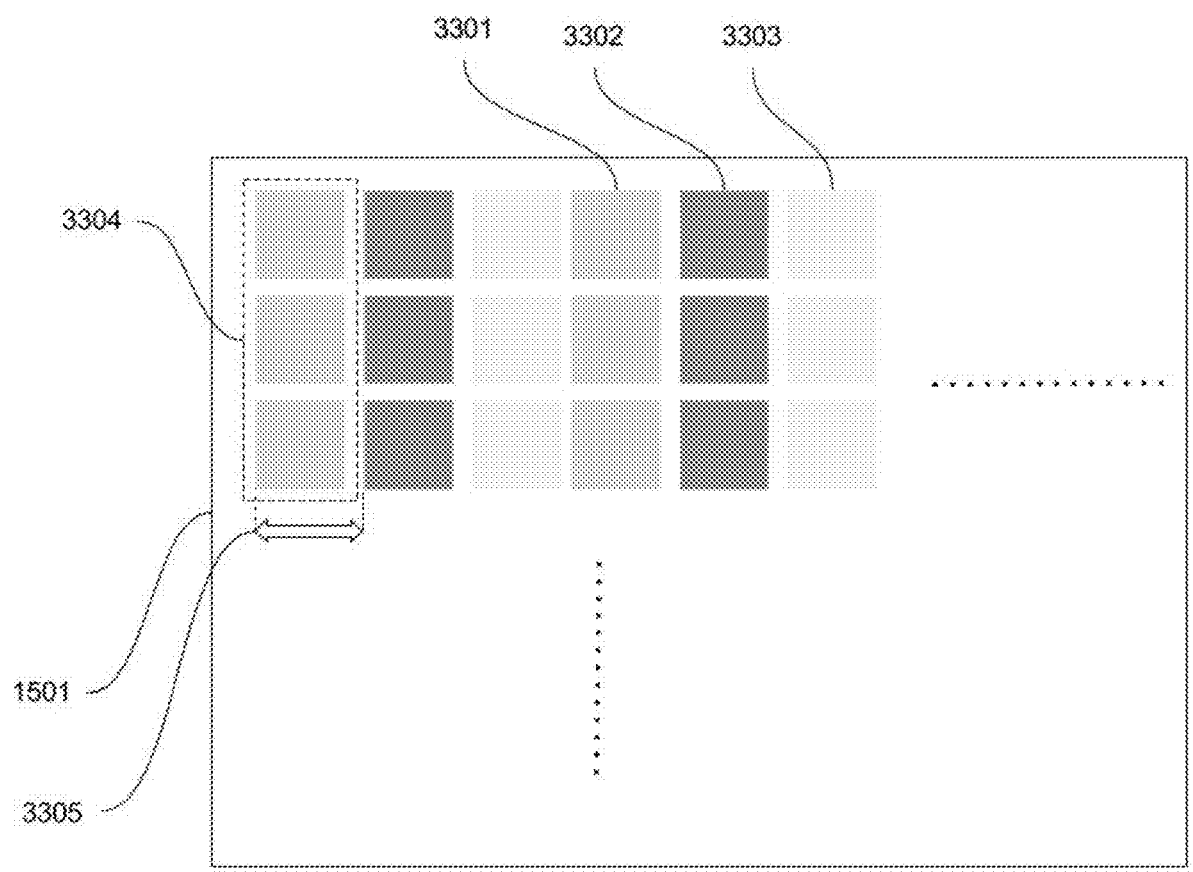
FIG. 33A shows a two dimensional arrangement of micro devices in a donor substrate.

Referring to FIG. 33A, in one embodiment, the donor substrate 1501 has micro device types 3301, 3302, and 3303 and they are patterned in the form of one dimensional arrays 3304 in which for each micro device 3301, 3302, or 3303 from one type, there is at least a micro device from another type that their pitch 3305 matches the pitch of the corresponding areas (or pads) on the receiver (or system) substrate.

Figure 33B:
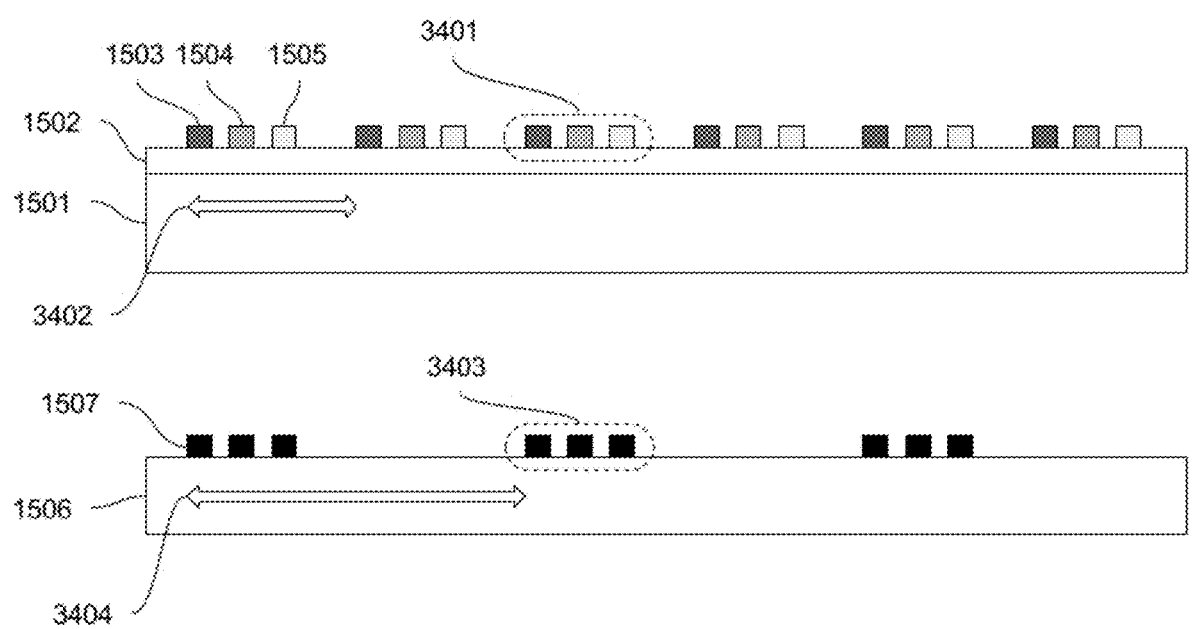
FIG. 33B is a cross section of a system substrate and a micro device substrate.

As an example, in one embodiment shown in FIG. 33B, the pitch 3404 of contact pads 1507 is two times larger than the pitch 3402 of the micro devices 3401 as shown in FIG. 33.

Figure 34:
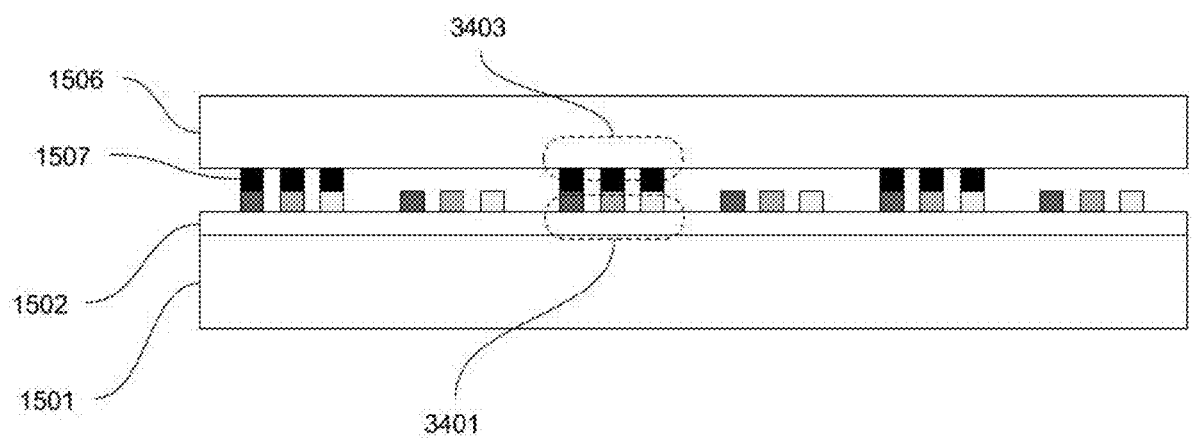
FIG. 34 is a cross section of a bonded system substrate and micro device substrate.

Referring to FIG. 34, the system substrate 1506 and micro device substrate 1501 are brought together, aligned and put in contact.

Figure 35:
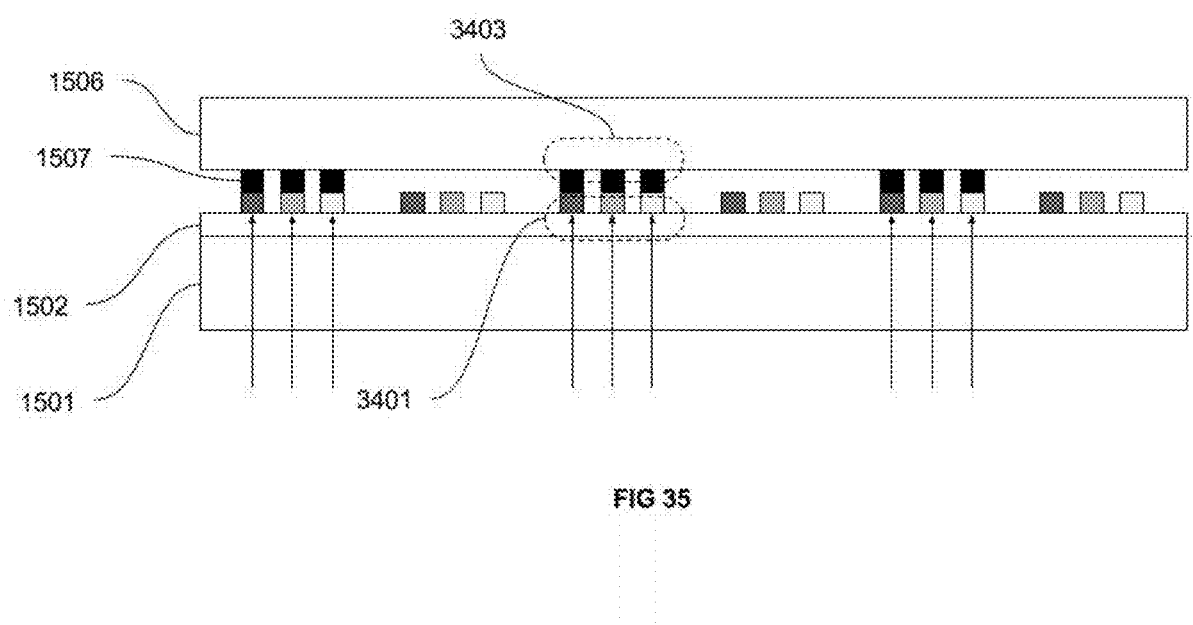
FIG. 35 shows the laser lift-off step for a micro device substrate in a transfer process.
Figure 36:
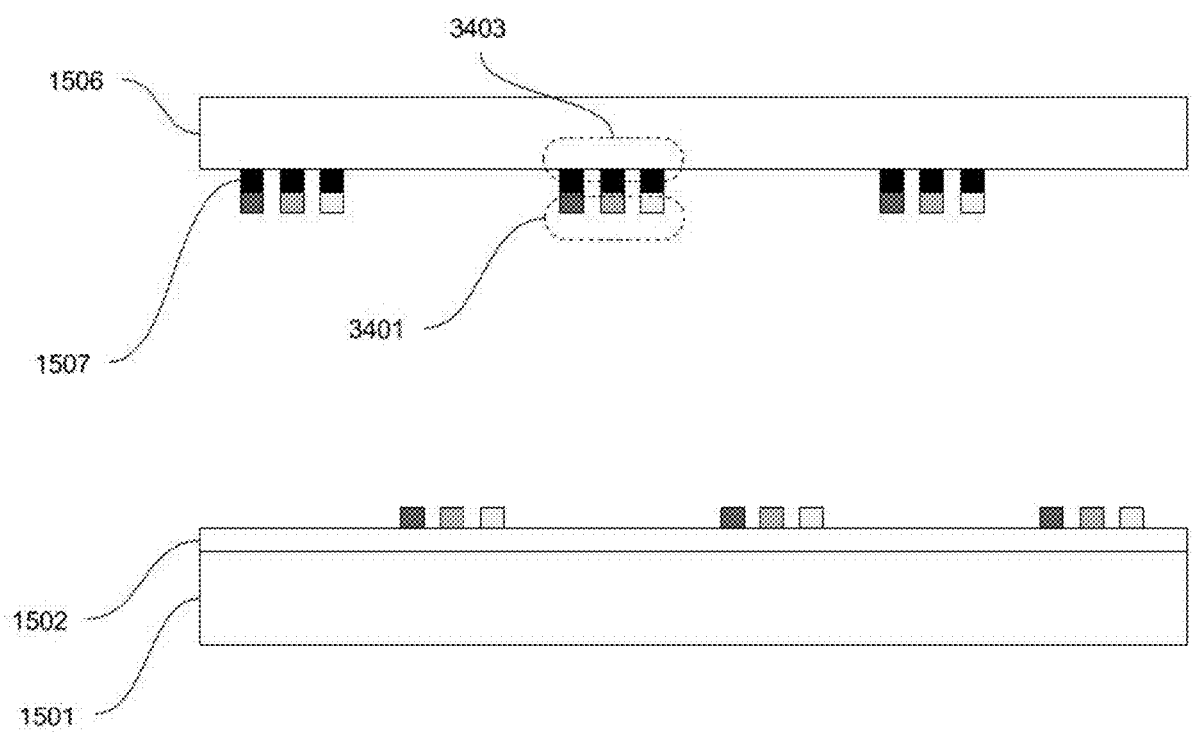
FIG. 36 is a cross section of a system substrate and a micro device substrate after the selective transfer process.
Figure 37:
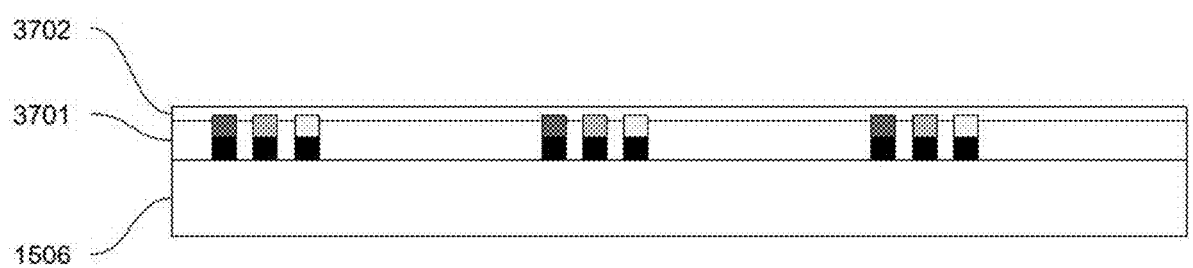
FIG. 37 shows an integrated system substrate with a common top electrode.

As shown in FIG. 35 and FIG. 36, methods such as laser lift-off (LLO) may be used to selectively transfer the micro devices 3401 to the contact pads 3403 on the system substrate 1506. As shown in FIG. 37, transfer may be followed by depositing a filler layer 3701 and a conformal conductive layer 3702 on top of the system substrate as the common electrode.

In another embodiment shown in FIG. 38, a buffer layer 3801 is necessary as a material template for the fabrication of micro devices 1503, 1504, and 1505.

Figure 38A:
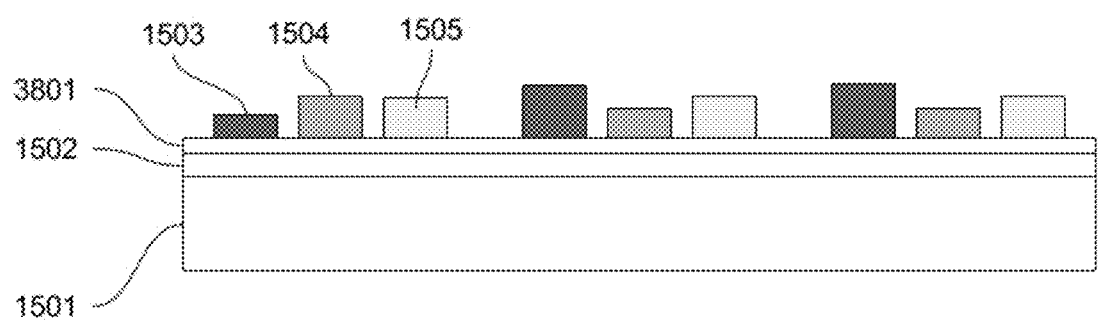
FIG. 38A is a cross section of a micro device substrate with micro devices having different heights.
Figure 38B:
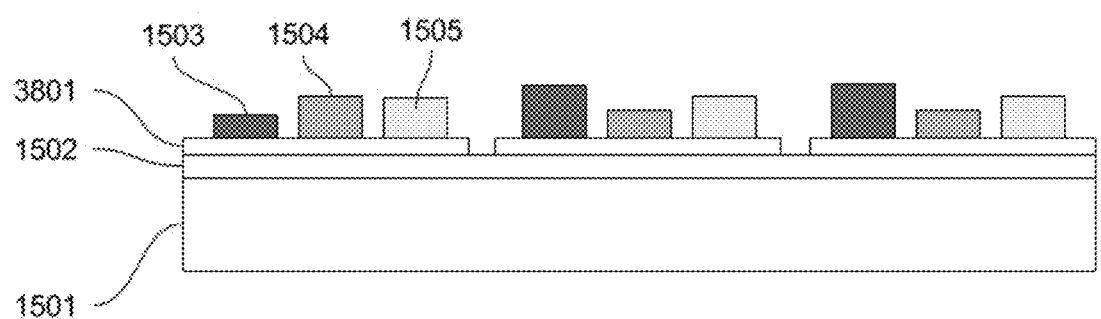
FIG. 38B is the cross section shown in FIG. 38A after the buffer layer has been patterned.

Still referring to FIG. 38A and FIG. 38B, the buffer layer 3801 is deposited on the sacrificial layer 1502 and patterned to isolate micro devices 1503, 1504, and 1505. In some cases, the sacrificial layer 1502 may be patterned as well.

In one embodiment, instead of isolating individual micro devices, groups of micro devices may be isolated from one another (as shown in FIG. 38) to facilitate the transfer process.

Figure 39:
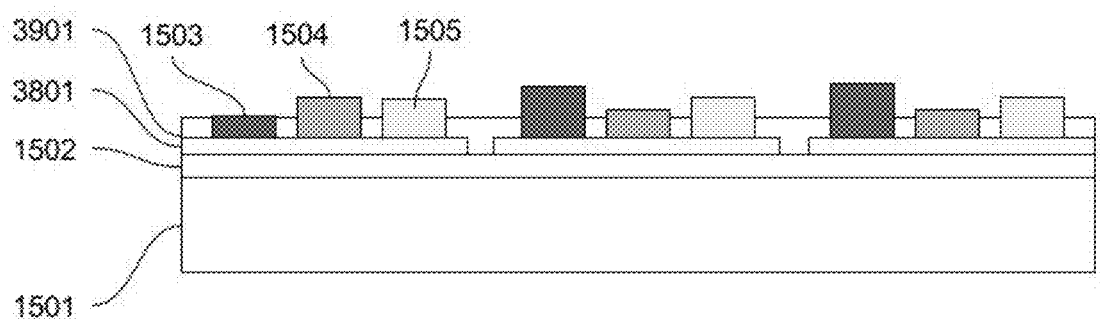
FIG. 39 is a cross section of a micro device substrate with a filler layer.

Referring to FIG. 39, a filling material 3901 such as but not limited to polyimide may be spin coated on the substrate to fill the gap between the individual micro devices. This filling step insures the mechanical strength during the transfer process. This is particularly important when a process like laser lift-off is used to detach micro devices from the carrier substrate.

Figure 40:
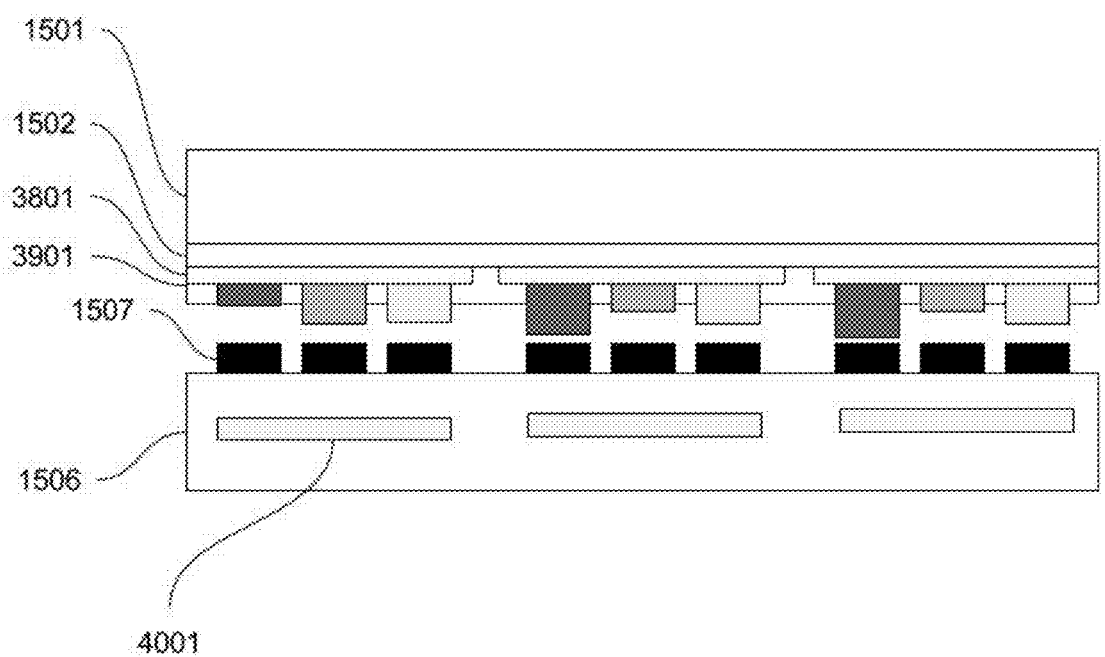
FIG. 40 shows the alignment step for a system substrate with grip mechanisms and a micro device substrate in a transfer process.

Referring to FIG. 40, micro devices may not have the same height which make it difficult to bond them to the system substrate. In these cases, one can implement an electrostatic grip mechanism 4001 or other grip mechanisms in the system substrate to temporarily keep the micro devices on the system substrate for the final bonding steps. The grip mechanism may be local for micro devices or a global grip for a group of micro devices as in the case of same-pitch transfer for the whole wafer. The grip mechanism may be on a layer above the contact electrode. In this case, a planarization layer may be used.

Figure 41A:
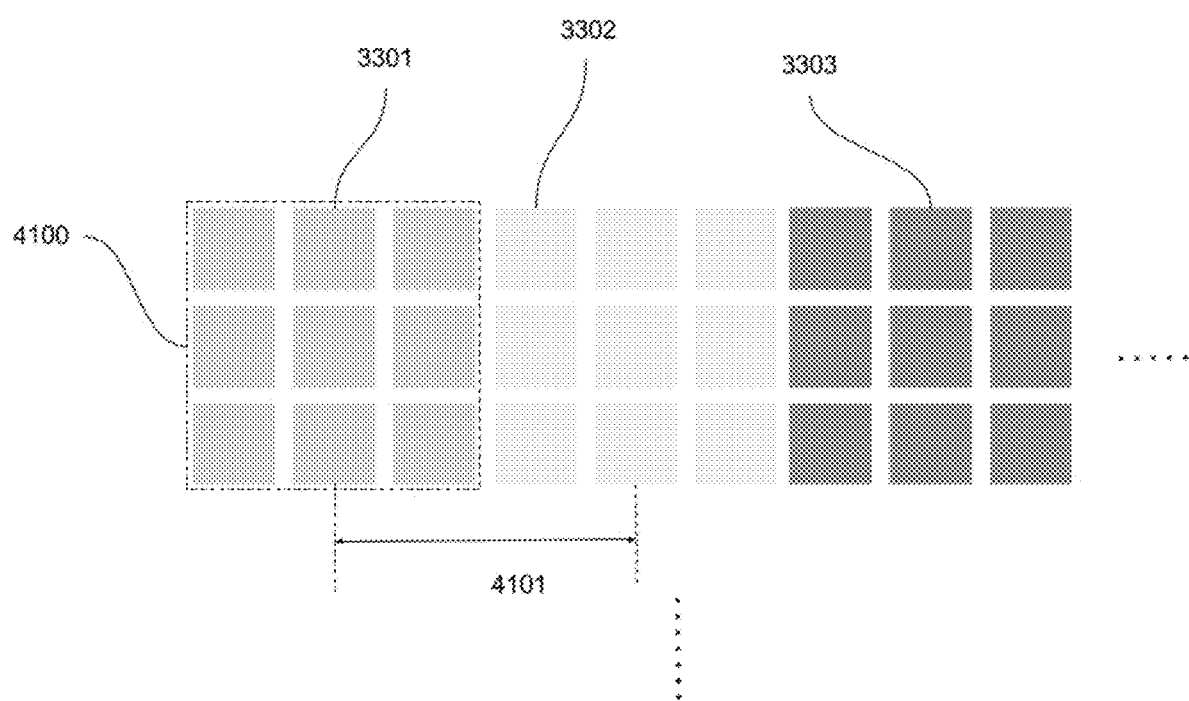
FIG. 41A shows a two dimensional arrangement of micro devices in a donor substrate.

In one embodiment, referring to FIG. 41A, the pattern of different micro device types 3301, 3302, and 3303 on donor substrate create a two-dimensional array of each type (for example array 4100) where the pitch between the arrays 4101 (defined as the center-to-center distance between adjacent arrays) matches the pitch of the corresponding area on the system substrate.

Figure 41B:
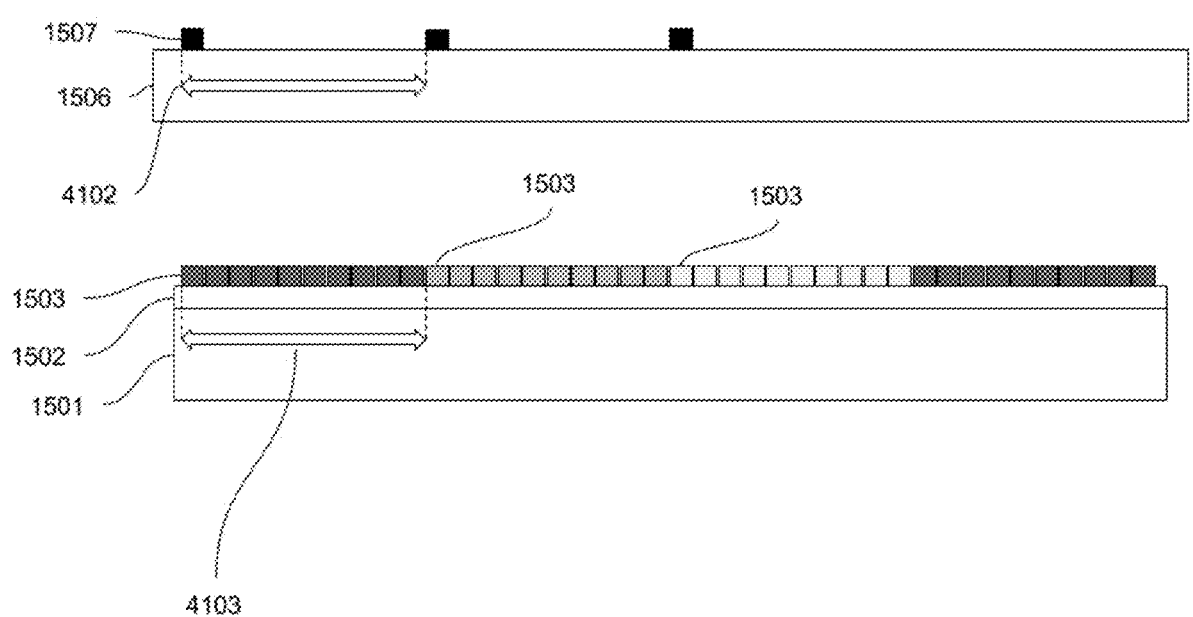
FIG. 41B is a cross section of a system substrate and a micro device substrate with different pitches.
Figure 42:
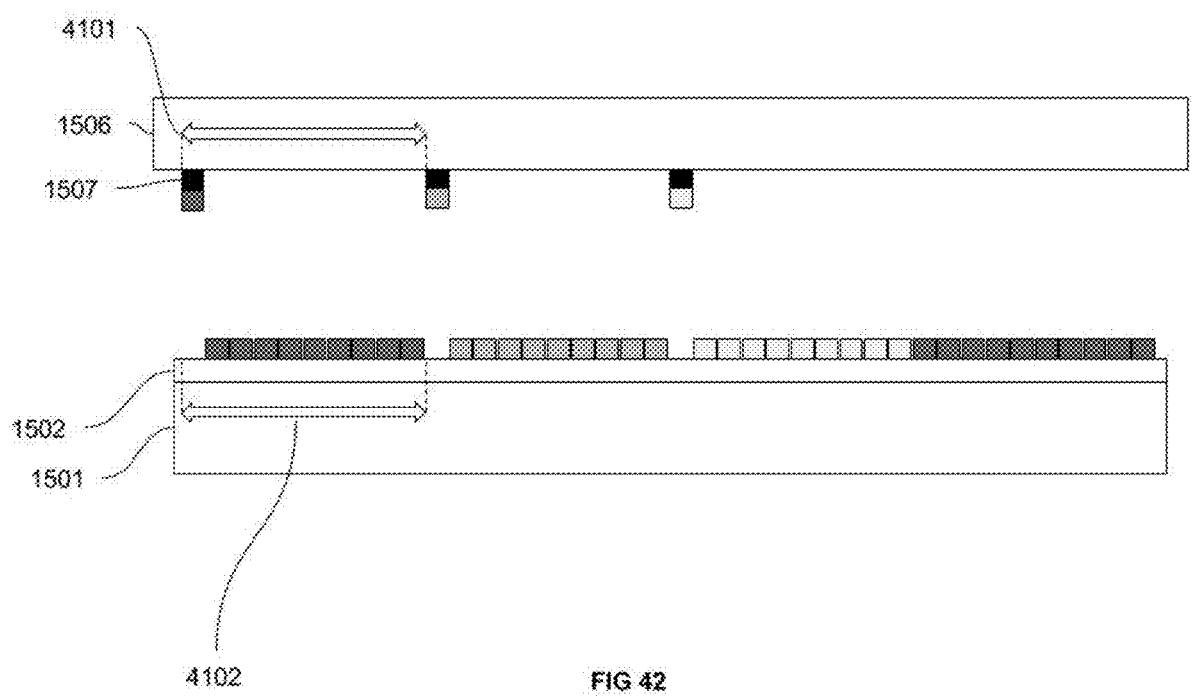
FIG. 42 shows the selective micro device transfer process for a system substrate and a micro device substrate with different pitches.

In one embodiment shown in FIG. 41B and FIG. 42, when sub-device pitch 4101 is larger than the normal distance between fabricated individual micro devices on their substrate (e.g., in large displays), micro device substrate 1501 is laid out in the form of two-dimensional single color arrays. Here, the contact pad pitch 4102 and the micro device array pitch 4103 are the same. Using this technique, one may relax the micro device fabrication requirements and reduce the selective transferring process as compared to that described above.

Figure 43:
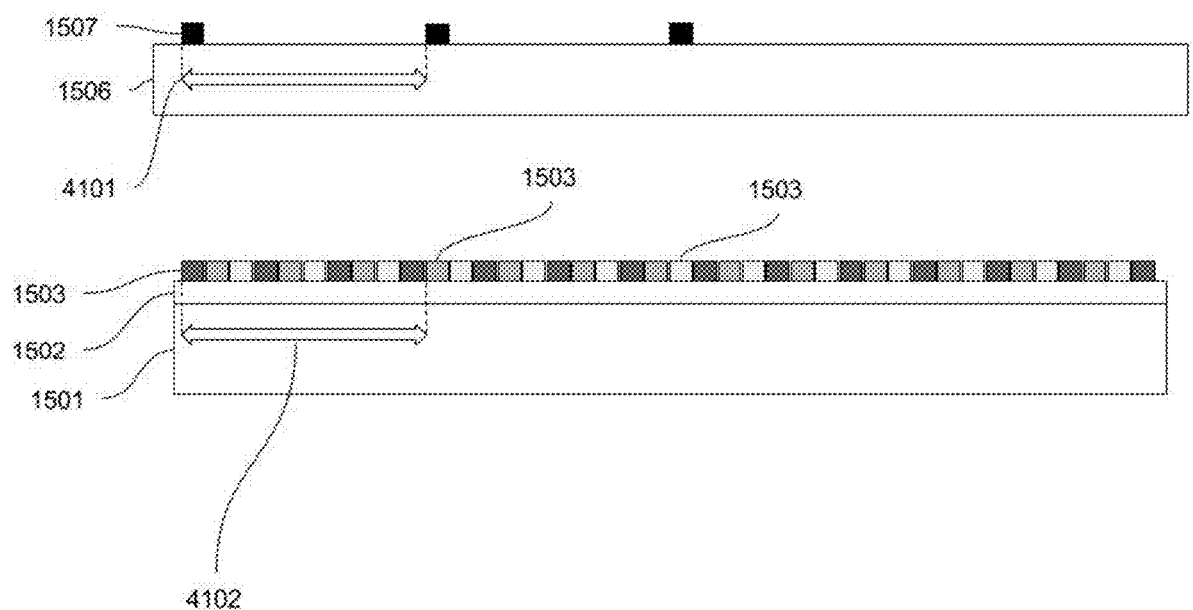
FIG. 43 is a cross section of a system substrate and a micro device substrate with different pitches.
Figure 44:
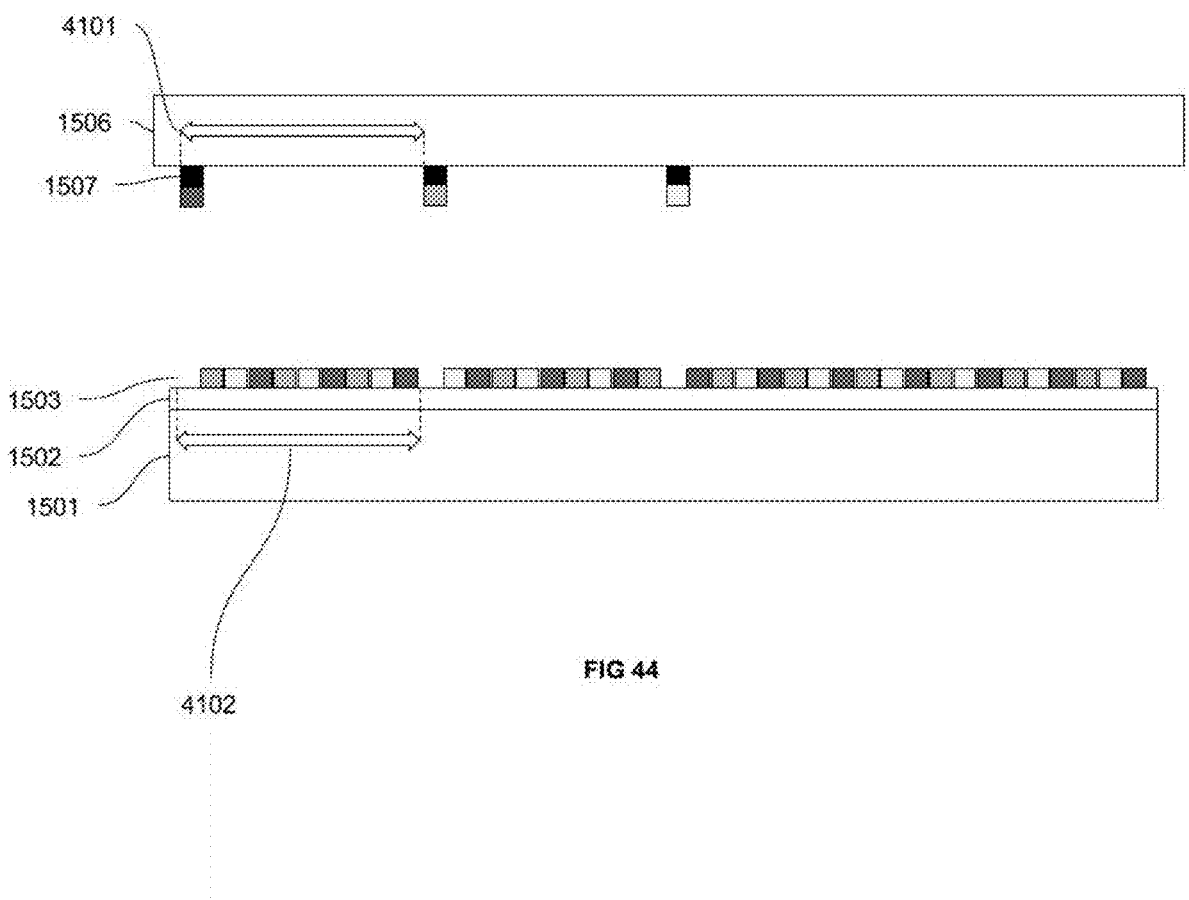
FIG. 44 shows the selective micro device transfer process for a system substrate and a micro device substrate with different pitches.

FIG. 43 and FIG. 44 shows an alternative pattern where micro devices are not formed in two-dimensional groups and the different micro devices uniformly placed across the substrate as it shown in FIG. 43 for three different micro devices.

Figure 45:
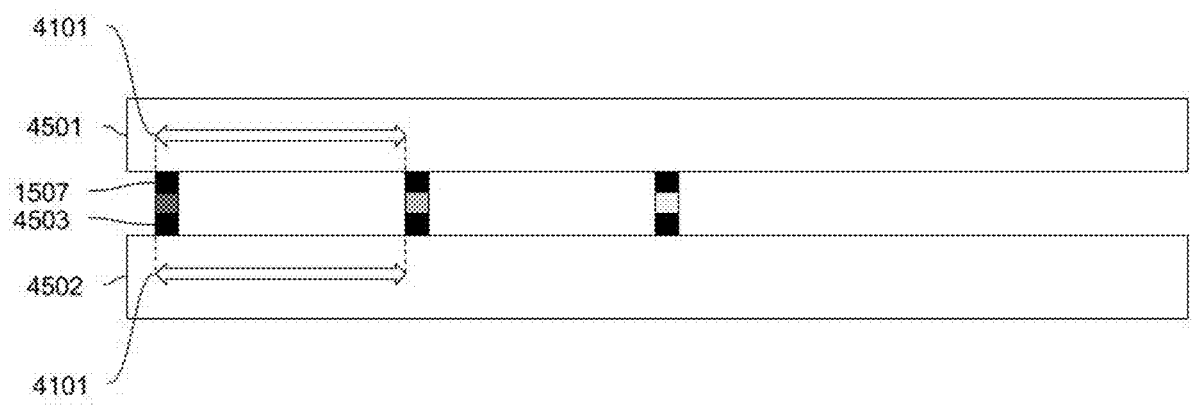
FIG. 45 shows an integrated micro device substrate.

Referring to FIG. 45, in another embodiment, micro devices are first transferred to a conductive semi-transparent common substrate 4501, then they are bonded to a system substrate 4502.

Color Conversion Structure

In some embodiments where the micro devices are optical devices such as LEDs, one can use either color conversion or color filters to define different functionality (different colors in the case of pixels). In this embodiment, two or more contact pads on the system substrate are populated with the same type of optical device. Once in place, the devices on the system substrates are then differentiated by different color conversion layers.

Figure 46A:
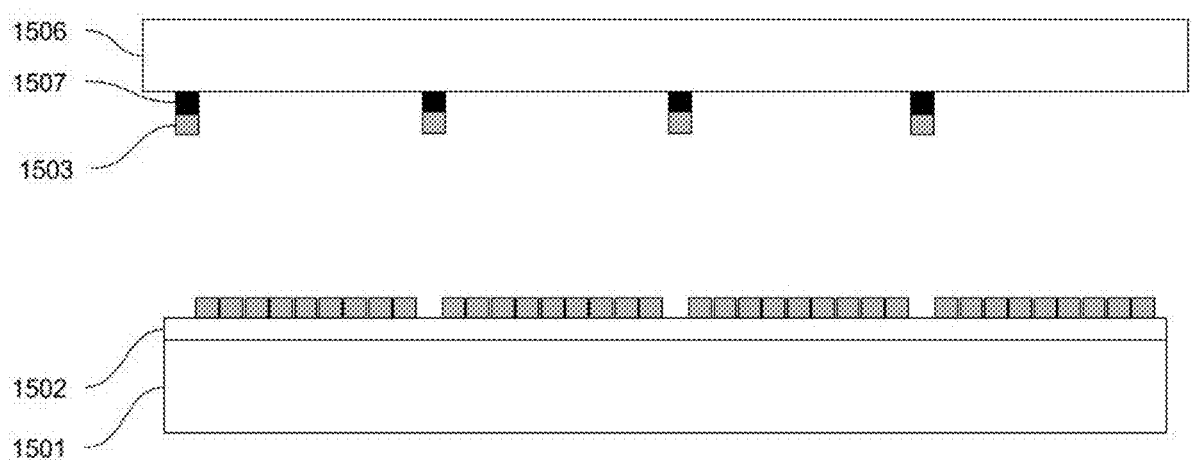
FIG. 46A shows the transfer process of micro devices to a system substrate with a planarization layer, a common top electrode, bank structures, and color conversion elements.
Figure 46B:
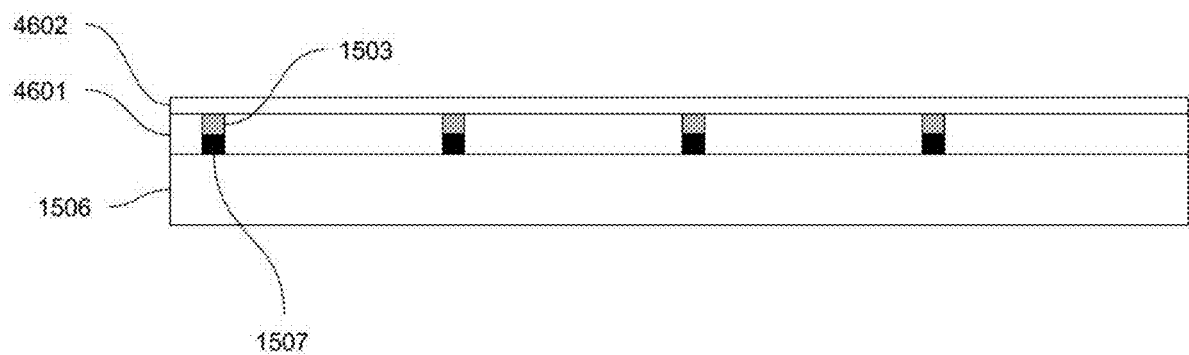
FIG. 46B shows the structure of FIG. 46A with the addition of a common electrode formed on the planarization layer.

Referring to FIG. 46A and FIG. 46B, in one embodiment, after transferring micro devices 1503 to the system substrate 1506, the whole structure is covered by a planarization layer 4601. A common electrode 4602 is then formed on the planarization layer 4601. The planarization layer can be the same height as, taller than, or shorter than the stacked devices. If the planarization layer is shorter (or there is no planarization layer) the wall of the device can be conformally covered by passivation materials.

Figure 47:
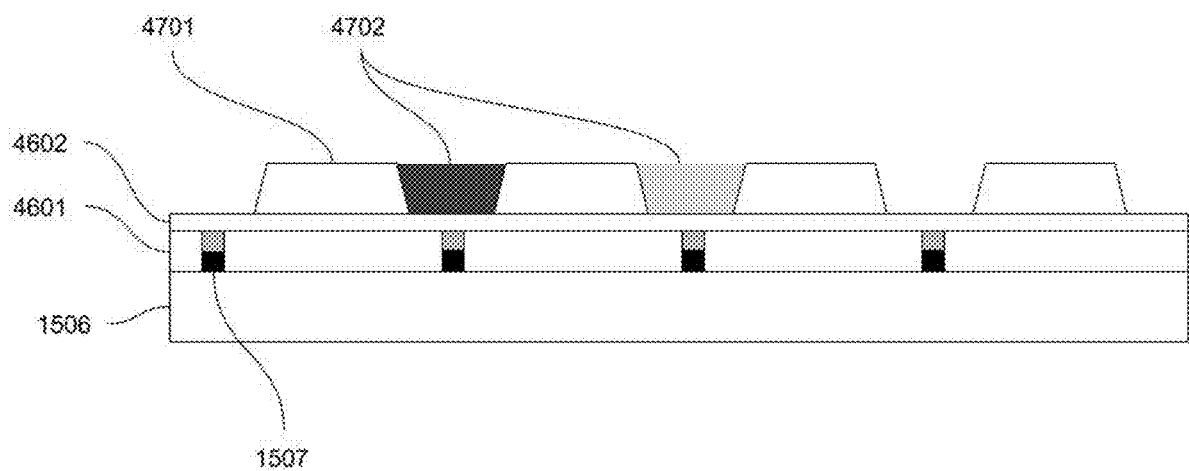
FIG. 47 shows a structure with color conversion for defining the color of pixels.

Referring to FIG. 47, a bank structure 4701 is developed (especially if a printing process is used to deposit the color conversion layers). The bank can separate each pixel or just separate different color conversion materials 4702.

Figure 48:
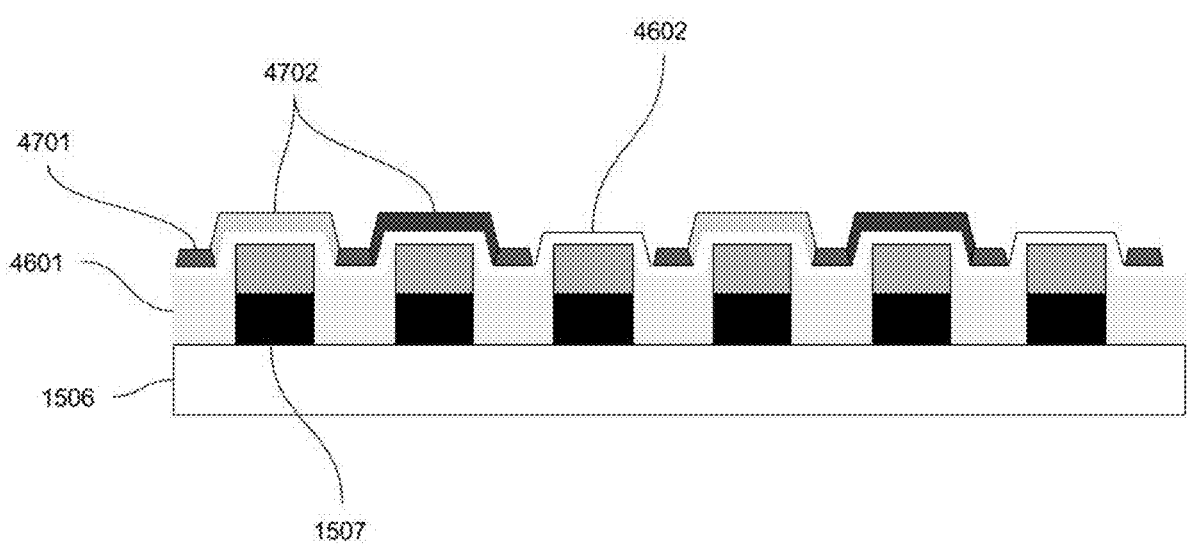
FIG. 48 shows a structure with conformal common electrode and color conversion separated by a bank layer.

FIG. 48 shows an integrated structure where the color conversion layer 4702 fully covers the top of the transferred micro devices and partially covers their sides. Bank 4701 separates the color conversion layers 4702 and the electrode 4602 is a common contact for all transferred micro devices.

Figure 49:
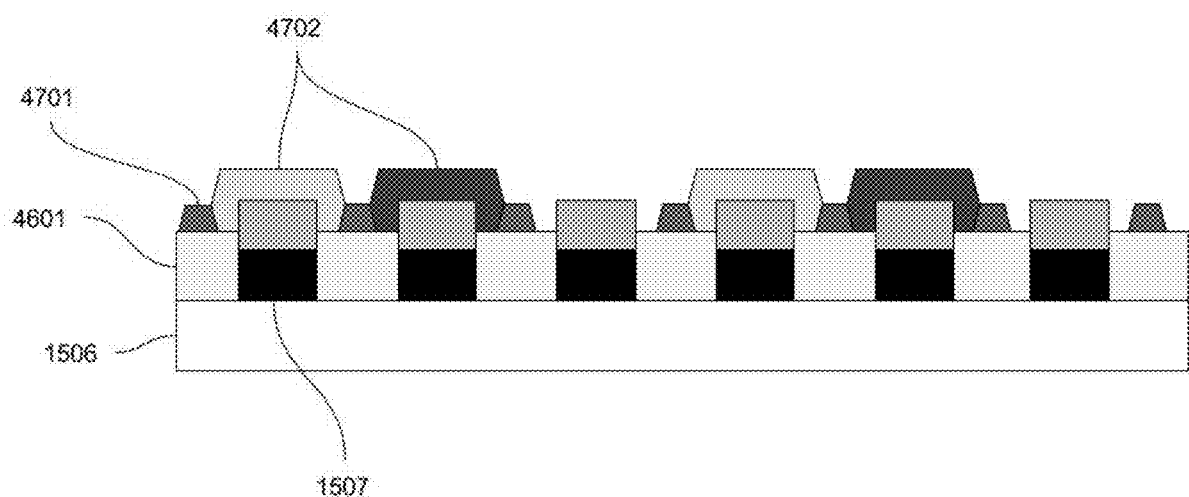
FIG. 49 shows a structure with conformal color conversion separated by a bank layer.

FIG. 49 shows an integrated structure where the color conversion layer 4702 fully covers the top of the transferred micro devices and partially covers their sides. Bank 4701 separates the color conversion layers and contacts to the micro devices are made only through the system substrate 1506.

Figure 50:
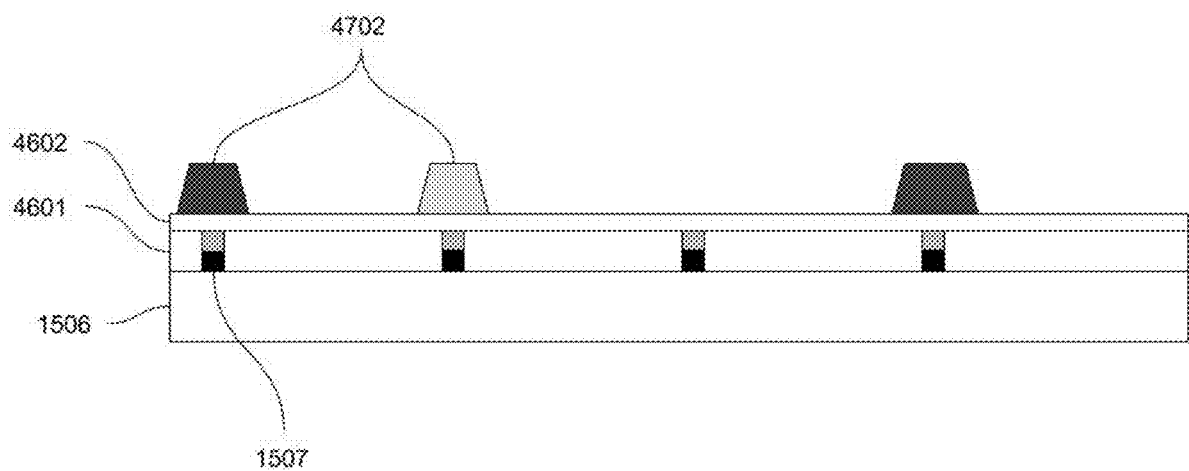
FIG. 50 shows a structure with color conversion elements on the common electrode without the bank layer.

FIG. 50 shows an integrated structure where the color conversion layer is directly formed on the common electrode 4602. In this case no bank layer is used.

Figure 51:
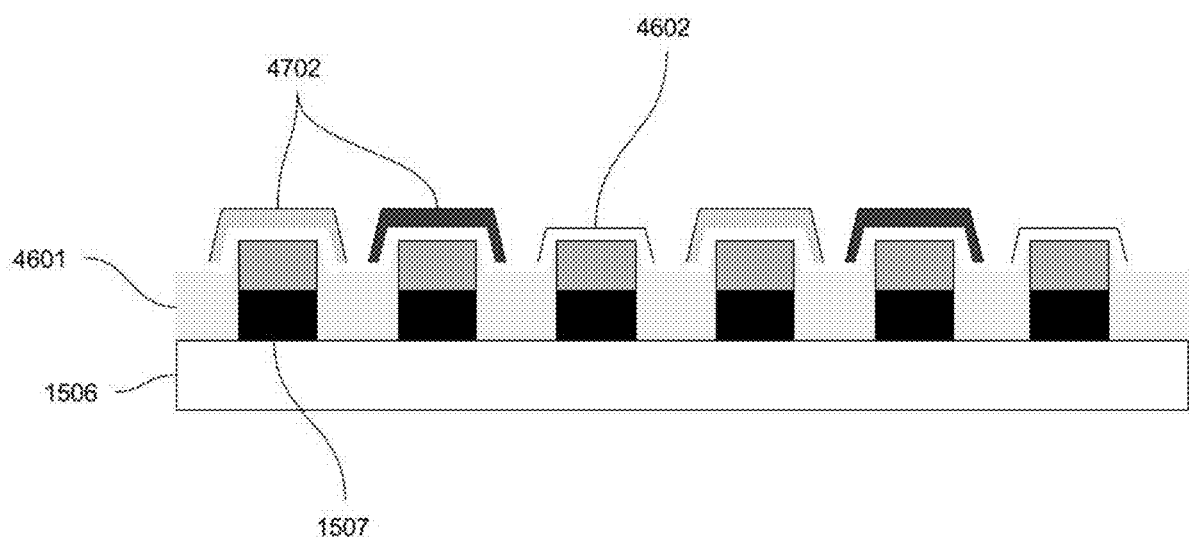
FIG. 51 shows a structure with conformal common electrode and color conversion.

FIG. 51 shows an integrated structure where the color conversion layer 4702 fully covers the top of the transferred micro devices and partially covers their sides. The electrode 4602 is a common contact for all transferred micro devices. In this case no bank layer is used.

Figure 52:
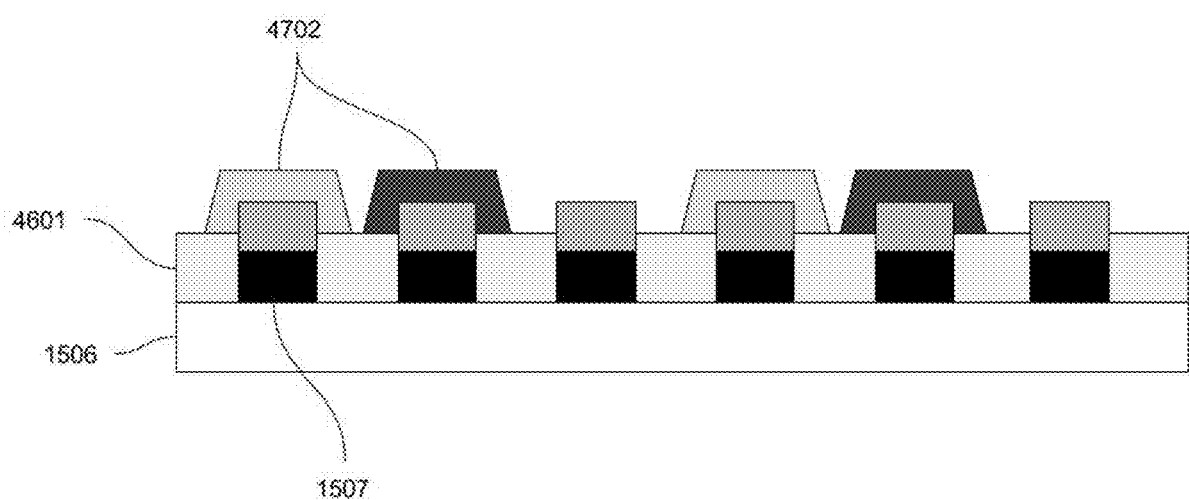
FIG. 52 shows a structure with conformal color conversion elements formed directly on the micro devices.

FIG. 52 shows an integrated structure where the color conversion layer 4702 fully covers the top of the transferred micro devices and partially covers their sides. The contacts to the micro devices are made only through the system substrate. In this case no bank layer is used.

Figure 53A:
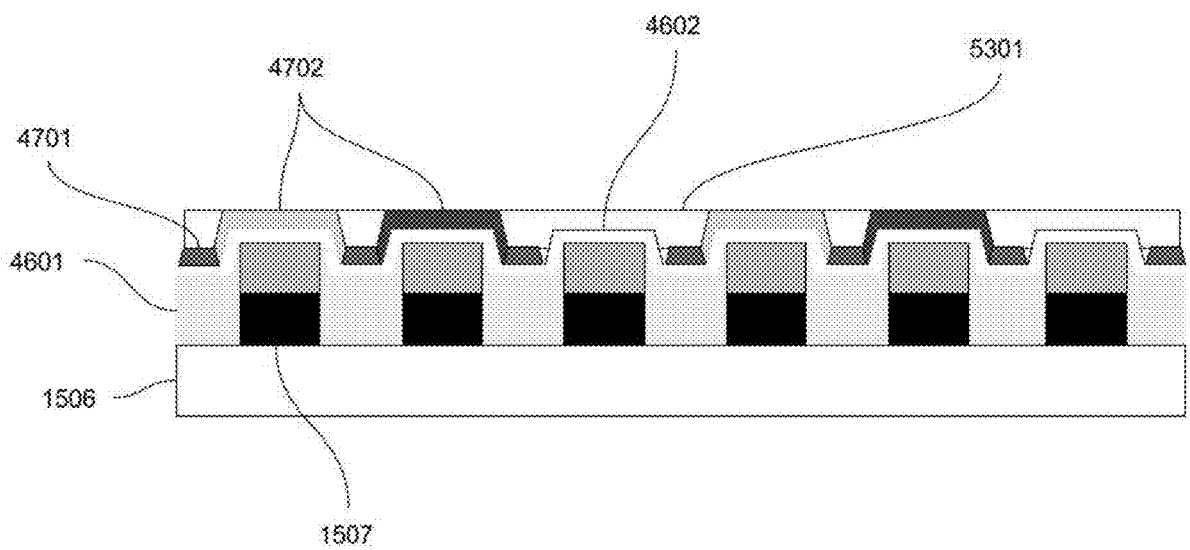
FIG. 53A shows a structure with color conversion for defining pixel color, a planarization layer, and a common transparent electrode.
Figure 53B:
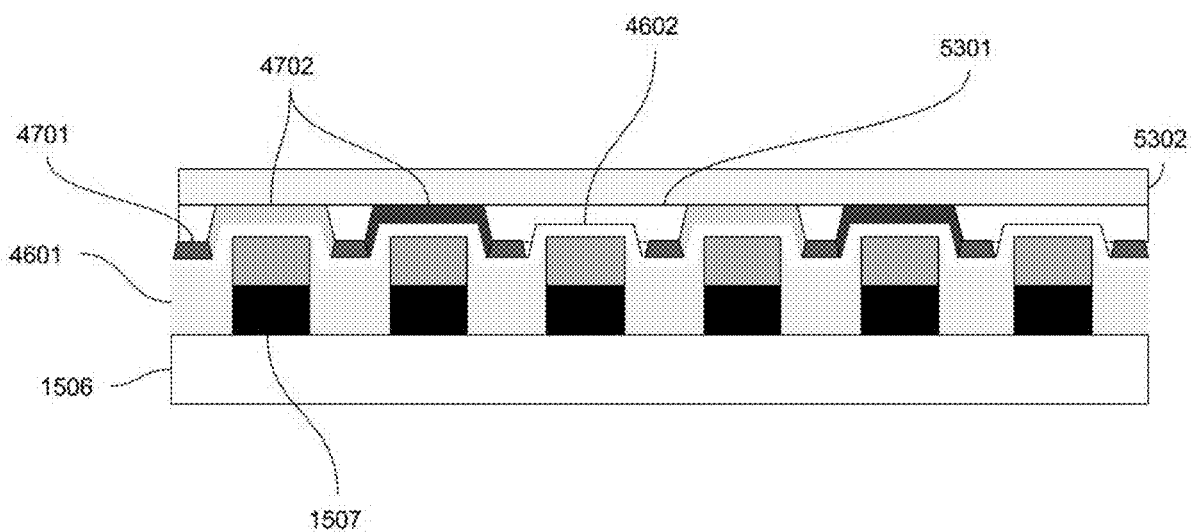
FIG. 53B shows the structure of FIG. 53A after forming the encapsulation layer.
Figure 54A:
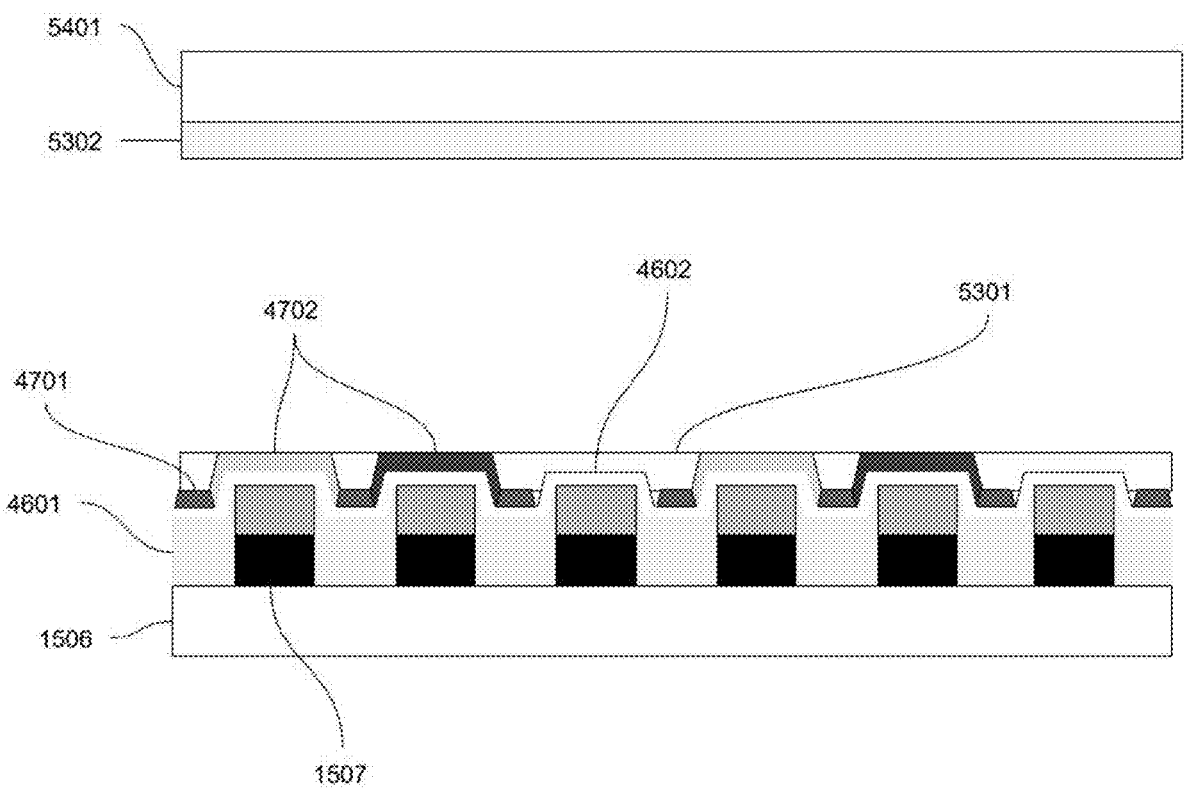
FIG. 54A shows a structure with color conversion for defining pixel color and a separate substrate for encapsulation.
Figure 54B:
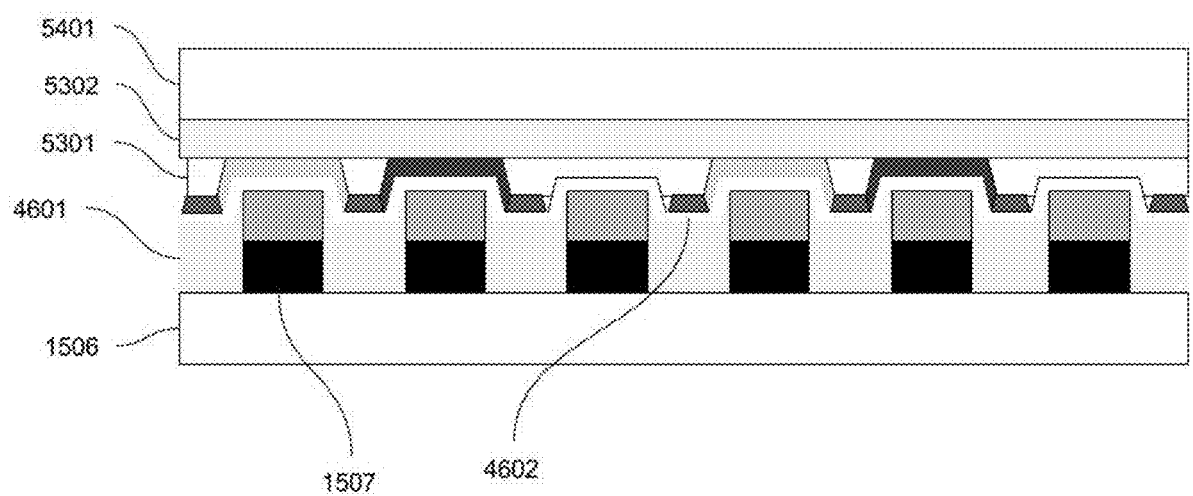
FIG. 54B shows the structure of FIG. 54B after the substrate coated with the encapsulation layer is bonded to the integrated system substrate.

In one embodiment, shown in FIG. 53A and FIG. 53B, after forming the color conversion material 4702 on the integrated system substrate 1506, a planarization layer 5301 is deposited on the structure. In some cases where the color conversion material and/or other components of the integrated substrate need to be protected from environmental conditions, an encapsulation layer 5302 is formed over the whole structure. It should be noted that the encapsulation layer 5302 may be formed from a stack of different layers to effectively protect the integrated substrate from environmental conditions Referring to FIG. 54A and FIG. 54B, in another embodiment a separate substrate 5401 coated with the encapsulation layer 5302 may be bonded to the integrated system substrate.

The embodiments depicted in FIG. 53 and FIG. 54 may be combined in which encapsulation layer 5302 is formed both on the structure and the separate substrate for more effective capsulation.

The common electrode is a transparent conductive layer deposited on the substrate in the form of a blanket. In one embodiment, this layer can act a planarization layer. In some embodiments, the thickness of this layer is chosen to satisfy both optical and electrical requirements.

The distance between the optical devices may be chosen to be large enough so as to reduce cross-talk between the optical devices or a blocking layer is deposited between the optical devices to achieve this. In one case, the planarization layer functions also as a blocking layer.

After the color conversion layers are deposited, different layers such as polarizers can be deposited.

In another aspect, color filters are deposited on the color conversion layers. In this case wider color gamut and higher efficiency may be achieved. One can use a planarization layer and/or bank layer after the color conversion layer before depositing the color filter layers.

The color filters can be larger than the color conversion layer to block any light leakage. Moreover, a black matrix can be formed between the color conversion islands or color filters.

Figure 55A:
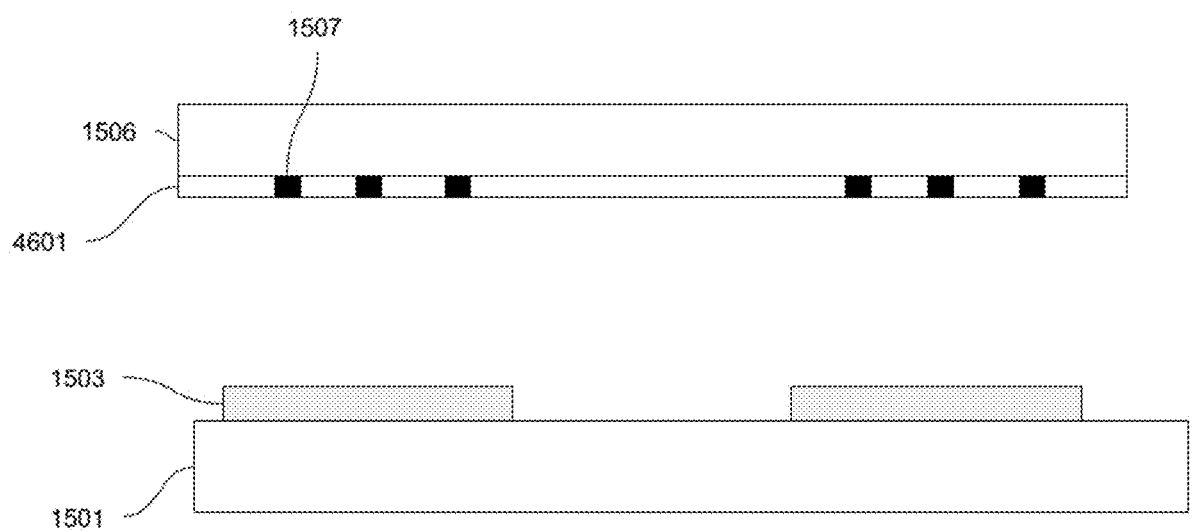
FIG. 55A shows a structure with a system substrate with contact pads, and a separate donor substrate with micro devices.
Figure 55B:
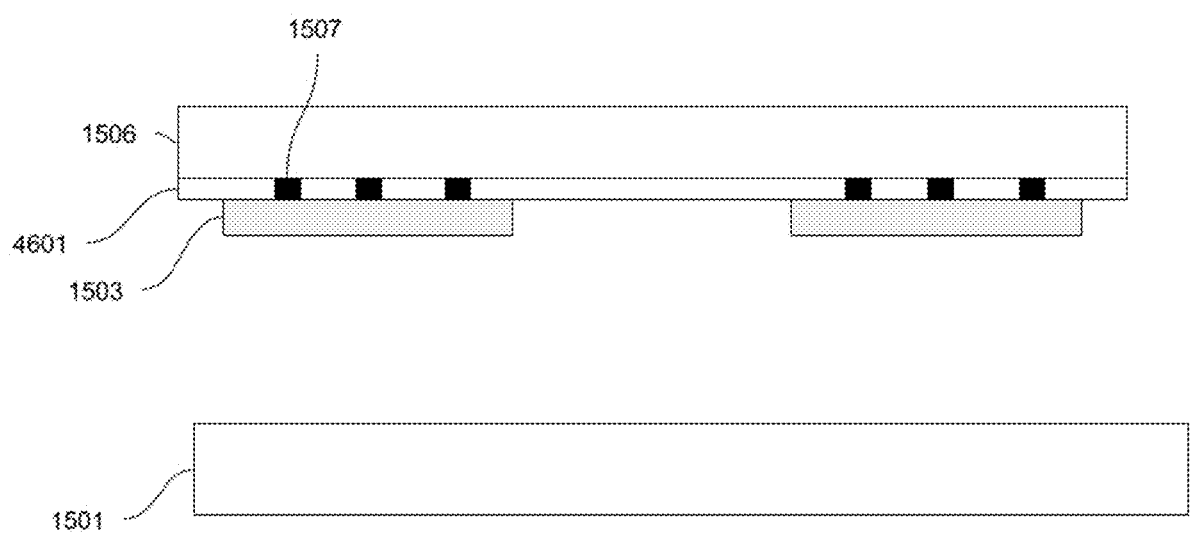
FIG. 55B shows the structure of FIG. 55A after the micro devices are transferred to the system substrate.
Figure 55C:
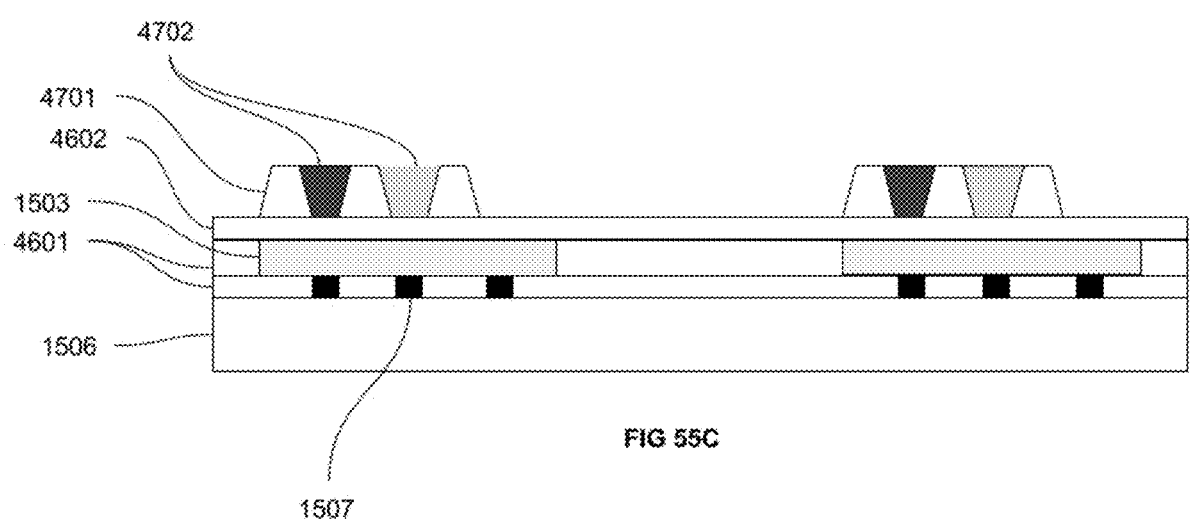
FIG. 55C shows the structure of FIG. 55B after post processing to deposit a common electrode and color conversion layers.

FIGS. 55A, 55B, and 55C illustrate structures where the device is shared between a few pixels (or sub-pixels). Here the micro device 1503 is not fully patterned but the horizontal condition is engineered so that the contacts 1507 define the area allocated to each pixel. FIG. 55A shows the system substrate 1506 with contact pads 1507 and a donor substrate 1501 with micro devices 1503. After the micro devices 1503 are transferred to system substrate (shown in FIG. 55B), one can do post processing (FIG. 55C) such as depositing common electrode 4602, color conversion layers 4702, color filters and so on. FIG. 55C shows one example of depositing color conversion layers 4702 on top of the micro device 1503. However, the methods described in this disclosure and other possible method can be used.

It is possible to add the color conversion layers as described into pixel (or sub-pixel) active areas after formation of the active area. This can offer a higher fill factor and higher performance and also avoid color leaking from the side pixel (or sub-pixel) if the active area of the pixel (or sub-pixel) is covered by reflective layers.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. An integrated device comprising:
    a plurality of micro devices integrated on a receiver substrate;
    a patterned filler layer formed about at least a first micro device; and
    a reflective layer formed around and over the patterned filler layer to confine light emitted by the at least first micro device within an active area of the at least first micro device;
    wherein the reflective layer is patterned in vertical and horizontal directions to form a touch screen crossing electrode.

2. The integrated device according to claim 1, wherein the reflective layer is covering at least a portion of one of: a top and a bottom of the patterned filler layer and confining at least a portion of incoming or outgoing light within the active area of the first micro device.

3. The integrated device according to claim 2, wherein the reflective layer is fabricated as an electrode of the first micro device.

4. The integrated device according to claim 1, wherein the patterned filler layer is further formed about a second micro device and between the first micro device and the second micro device.

5. The integrated device according to claim 1, wherein the patterned filler layer is comprised of a dielectric filler material.

6. The integrated device according to claim 1, further comprising:
    a dielectric layer formed between the reflective layer and the patterned filler layer.

7. The integrated device according to claim 1, further comprising;
    a transparent conductive layer formed over a top of the first micro device; and
    a contact pad formed at a bottom of the first micro device, wherein the contact pad is formed with a concave structure capable of enhancing the outcoupling of light from the first micro device.

8. The integrated device according to claim 1, wherein the reflective layer is fabricated as a portion of the electrode of the first micro device.

9. The integrated device according to claim 1, wherein the reflective layer is covered by a black matrix to reduce an ambient reflection of the integrated device.

10. The integrated device of claim 1, wherein a dielectric is used between vertical and horizontal traces.

11. The integrated device of claim 1, wherein the reflective layer is opaque.

12. The integrated device of claim 1, wherein the reflective layer is a metallic bilayer.

13. The integrated device of claim 1, wherein the reflective layer has multiple layers.

* * * * *